(12) United States Patent
Shah et al.

(10) Patent No.: US 12,631,678 B2
(45) Date of Patent: May 19, 2026

(54) LED CHARACTERIZATION AND COMPENSATION METHODS AND SYSTEMS

(71) Applicant: Cepheid, Sunnyvale, CA (US)

(72) Inventors: Amish Shah, Sunnyvale, CA (US);
Marissa Lee, Sunnyvale, CA (US);
Jessica Koay, Sunnyvale, CA (US);
Richard J Casler, Jr., Sunnyvale, CA
(US)

(73) Assignee: Cepheid, Sunnyvale, CA (US)

( * ) Notice: Subject to any disclaimer, the term of this
patent is extended or adjusted under 35
U.S.C. 154(b) by 705 days.

(21) Appl. No.: 17/821,093

(22) Filed: Aug. 19, 2022

(65) Prior Publication Data

US 2023/0055359 A1     Feb. 23, 2023

Related U.S. Application Data

(60) Provisional application No. 63/235,625, filed on Aug.
20, 2021.

(51) Int. Cl.
*G01N 21/76*     (2006.01)
*B01L 7/00*     (2006.01)
(Continued)

(52) U.S. Cl.
CPC ............. *G01R 31/2635* (2013.01); *B01L 7/52*
(2013.01); *G01N 21/76* (2013.01);
(Continued)

(58) Field of Classification Search
CPC .................. G01R 31/2635; B01L 7/52; B01L
2300/0654; B01L 2300/1805;
(Continued)

(56) References Cited

U.S. PATENT DOCUMENTS 6,374,684 B1     4/2002 Dority
6,818,185 B1     11/2004 Petersen et al.
(Continued)

FOREIGN PATENT DOCUMENTS

DE     102007029123 A1     1/2009
EP         2717653 A1     4/2014
WO     2011058496 A2     5/2011

OTHER PUBLICATIONS

International Search Report and Written Opinion for International
Application No. PCT/US2022/040939, dated Jan. 10, 2023.
(Continued)

*Primary Examiner* — John Mcguirk
(74) *Attorney, Agent, or Firm* — Potomac Law Group,
PLLC; Reza Mollaaghababa; Ido Rabinovitch

(57)     ABSTRACT

Systems and methods for monitoring, characterizing and
controlling operation of LEDs are provided herein. Methods
includes measuring a voltage across the LED, and correlat-
ing the voltage to a junction temperature of the LED. This
correlation can be used to improve operation of the LED by
increasing the signal to noise ratio of the LED signal,
characterize the LED by comparing to an I-V curve, control
LED operation to compensate for LED degradation and
avoid crosstalk, and/or to generally improve performance
and life expectancy of the LED. Improved performance of
the LED can include stabilizing the photon output during
performance of an assay to provide a desired dye reporter
signal required for the assay and/or reducing an intra-shot
during of the LED output during the assay. System and
device with control units configured to perform these meth-
ods are also described herein.

15 Claims, 26 Drawing Sheets

(51) Int. Cl.
  *G01N 35/00*     (2006.01)
  *G01R 31/26*     (2020.01)
(52) U.S. Cl.
  CPC .................. *G01N 35/00693* (2013.01); *B01L 2300/0654* (2013.01); *B01L 2300/1805* (2013.01)
(58) Field of Classification Search
  CPC ............. G01N 21/76; G01N 35/00693; G01N 21/6452; G01N 21/645; G01N 2201/0624; G01N 2201/0627; H05B 45/14; H05B 45/18
  See application file for complete search history.

(56)         References Cited

U.S. PATENT DOCUMENTS

| | | |
|---|---|---|
| 8,048,386 B2 | 11/2011 | Dority et al. |
| 8,119,352 B2 | 2/2012 | Kozma et al. |
| 8,187,557 B2 | 5/2012 | Van Atta et al. |
| 9,237,620 B1 | 1/2016 | Knapp et al. |
| 2008/0214943 A1 | 9/2008 | Kara et al. |
| 2010/0176746 A1* | 7/2010 | Catalano ............... H05B 45/56 |
| | | 374/185 |
| 2013/0271751 A1 | 10/2013 | Macgegor et al. |
| 2013/0288348 A1 | 10/2013 | Breidenthal et al. |
| 2017/0021356 A1 | 1/2017 | Dority et al. |
| 2018/0092177 A1 | 3/2018 | Powers et al. |
| 2021/0037624 A1 | 2/2021 | Sorensen et al. |
| 2021/0283594 A1* | 9/2021 | Jasperse ................ G01N 21/03 |

OTHER PUBLICATIONS

European Patent Office, Communication—European Extended Search Report for Application No. 26162583.4 mailed on Mar. 30, 2026, 12 pages.

* cited by examiner

10

12

14

Detect Block Chip 920

Thermal Module
Assembly 800

Excite Block Chip
(on PCB carrier)
910

Schematic
Representation

| Excite | Detect |
|--------|--------|
| UV | Blue |
| Blue | Green |
| Green | Yellow |
| Yellow | Red |
| Red | Deep Red |
| | IR |

EXCITE BUCK CONVERTER

FIG. 14

LED CHARACTERIZATION AND COMPENSATION METHODS AND SYSTEMS

CROSS-REFERENCES TO RELATED APPLICATIONS

This application is a Non-Provisional of and claims the benefit of priority to U.S. Provisional No. 63/235,625 filed Aug. 20, 2021, which is incorporated herein by reference in its entirety.

This application is generally related to: U.S. patent application Ser. No. 15/217,920 entitled "Molecular Diagnostic Assay System," filed on Jul. 22, 2016; U.S. patent application Ser. No. 13/843,739 entitled "Honeycomb tube," filed on Mar. 15, 2013; U.S. Pat. No. 8,048,386 entitled "Fluid Processing and Control," filed Feb. 25, 2002; and U.S. Pat. No. 6,374,684 entitled "Fluid Control and Processing System," filed Aug. 25, 2000; each of which is incorporated herein by reference in its entirety for all purposes.

BACKGROUND OF THE INVENTION

In recent years, technological advancements have greatly improved the performance and capabilities of diagnostic assay systems, however, a number of challenges remain. Many such diagnostic assay systems utilizing optical excitation and detection units that are used to detect target analytes in a biological sample. Processing of the biological sample often includes applying repeated thermal cycling to the sample and sustained operation of an optical component, both of which cause considerable fluctuations in temperature, which can adversely affect the performance of the optical unit. These changes can include changes in photon emission amplitude and spectrum, as well as a reduction of its useful life span. Additionally, these diagnostic assay systems are frequently used in areas where outbreaks of infectious diseases occur, including remote locations with inhospitable environments, extreme temperature and limited access to replacement components. This can be problematic when performing large-scale testing in such locations, as the environmental conditions can degrade or prolong testing, and failure of the optical components can render the diagnostic system ineffective. Therefore, there is a need for methods and systems that can characterize the health and performance of the optical unit of such systems, improve monitoring of the optical component, and further improve performance of the optical component.

BRIEF SUMMARY OF THE INVENTION

The invention pertains to systems having an optical component with one or more light-emitting diodes (LED), in particular, diagnostic assay systems having an optical unit for excitation/detection of a target analyte. In some embodiments, the invention relates to characterizing LED and/or optimizing LED performance by compensating for fluctuations due to temperature based on a measured voltage of the LED.

In one aspect, the invention pertains to a system for monitoring voltage across an LED ("LED voltage"). Such systems can include: a light-emitting diode (LED) configured to provide an optical output for excitation of a biological sample received within the instrument to monitor the performance of an assay; an optical detector configured to detect reactions in the sample in response to optical excitation within the assay; and a control unit having a processor and a voltage sensor, the control unit configured to operate the LED to monitor the performance of the assay. As described in the embodiments herein, the LED can be one of multiple LEDs within an optical calibration matrix that is used to calibrate the optical component, particularly after manufacture and/or service. Further, the optical unit can include LEDs of differing wavelengths (e.g. UV, blue, green, yellow, red, or any combination thereof). Each color can include one or more LEDs. As described herein, control of the LED by the control unit can include modifying a current operating the LED and/or a timing (e.g. duration, intra-shot timing/duration). The system can further include a processor with programmable instructions recorded thereon to: measure a voltage across the LED to operate at a given current; and correlating the voltage to a junction temperature of the LED such that the voltage is a proxy of the junction temperature. In some embodiments, the system includes a control unit further configured to: determine a characteristic and/or control the LED based on the measured voltage. In some embodiments, the correlation is determined without any temperature input from the excite block, or without any temperature sensor input. In some embodiments, the characteristic of the LED is determined by obtaining a current voltage (I-V curve during an output pulse of the LED and comparing to a reference I-V curve. Typically, the reference I-V curve is measured at the time of manufacturing (T=0). In some embodiments, the control unit is configured to determine the characteristic upon each start-up of the system. In some embodiments, the control unit is configured to determine the performance characteristic during operation of the LED, and/or to use the measured voltage to reduce the noise-to-signal ratio of the LED signal.

In another aspect, the monitoring system can magnify the voltage measured across the LED. In such embodiments, the control unit is configured to monitor the entire voltage range at a first resolution, and monitor a sub-range at a second resolution higher than the first resolution. In some embodiments, the second resolution is at least an order of magnitude higher than the first resolution. The control unit can be configured to increase resolution of the sub-range by amplifying the voltage signal within the selected sub-range. In some embodiments, the control unit is configured to increase resolution of the sub-range by: outputting a reference voltage in the selected sub-range and comparing the reference voltage to the LED signal within the sub-range. In some embodiments, the control unit is further configured to multiply a difference between the reference voltage and the voltage signal by a high gain, thereby increasing the resolution of the voltage measurement in the sub-range.

In another aspect, the invention pertains methods of monitoring an optical component of a diagnostic instrument. Such methods can include: starting-up and/or operating an LED to provide a photonic output; measuring, with a control unit operably coupled to the LED, a voltage across the LED operating at a given current; and correlating the voltage to a junction temperature of the LED such that the voltage is a proxy of the junction temperature. In some embodiments, the correlation is determined without any input of a temperature measurement from the excite block, or without any temperature measurement input. In some embodiments, the methods can include determining, with the control unit, a characteristic of the LED based on the measured voltage. The characteristic of the LED can be determined by obtaining an I-V curve during an output pulse of the LED and comparing to a reference I-V curve. In some embodiments, the control unit is configured to determine the performance characteristic upon each start-up of the system. The control unit can be configured to determine the performance characteristic during operation of the LED, and/or to use the measured voltage to reduce the noise-to-signal ratio of the LED photonic output signal.

In still another aspect, the invention pertains to a thermal compensation system for LED operation. Such systems can include: an LED configured to provide an optical output for excitation of a biological sample received within the instrument for an assay to detect a target analyte; an optical detector configured to detect reactions in the sample in response to optical excitation to detect the target analyte; and a control unit having a processor and a voltage sensor, the control unit configured to operate the LED to monitor the performance of the assay. The control unit can include a processor with instructions recorded thereon for: measuring a voltage across the LED during operation at a given current; correlating the voltage to a junction temperature of the LED such that the voltage is a proxy of the junction temperature; and determining fluctuations in the junction temperature of the LED in real-time. In some embodiments, controlling operation of the LED is based on the real-time determinations to compensate for fluctuations in photonic output of the LED due to changes in the junction temperature. In some embodiments, the LED is controlled based on the monitored voltage without any temperature sensor input from the excite block, or without any temperature measurement input.

In some embodiments, the control unit controls the LED to emit a series of shots, each shot having an intra-short duration of time. The control unit can control the LED, based on the measured voltage, to maintain a desired photon emission rate and a desired spectrum of the photonic output of the LED. In some embodiments, the control unit controls the LED, based on the measured voltage, to reduce the intra-shot duration of time, thereby reducing increase in junction temperature and associated fluctuations in photonic output, which can increase the LED life expectancy. The desired photon emission rate and spectrum correspond to a photonic output signal for excitation/detection of the target analyte.

In another aspect, the invention pertains to methods of operating an LED in a diagnostic instrument. Such methods can include: operating, with a control unit, an LED of the diagnostic instrument, to provide an optical output for excitation of a biological sample received within the instrument for an assay to detect a target analyte; operating, with the control unit, an optical detector to detect reactions in the sample in response to optical excitation to detect the target analyte; measuring, with the control unit, a voltage across the LED during operation when operating at a given current; correlating, with the control unit, the LED voltage to a junction temperature of the LED such that the voltage is a proxy of the junction temperature; determining, with the control unit, fluctuations in the junction temperature of the LED in real-time based on the correlation; and controlling, with the control unit, operation of the LED based on the real-time determinations to compensate for fluctuations in photonic output of the LED due to changes in the junction temperature of the LED. In some embodiments, the LED is controlled based on the measured voltage without any temperature measurement input from the excite block, or without any temperature measurement input. In some embodiments, the control unit controls the LED to emit a series of shots, each shot having an intra-short duration of time. The control unit can control the LED, based on the measured voltage, to maintain a desired photon emission rate and a desired spectrum. In some embodiments, the control unit controls the LED, based on the measured voltage, to reduce the intra-shot duration of time, thereby reducing increase in junction temperature to reduce fluctuations of the photonic output of the LED. In some embodiments, the desired photon emission rate and spectrum correspond to a photonic output signal (i.e. dye reporter signal) for excitation/detection of the target analyte. In another aspect, it is understood that LED degradation of one or more LEDS causes imbalance in an optical calibration matrix that results in crosstalk between dye reporters. This imbalance can be corrected by adjusting the current applied to the LED. In some embodiments, this compensation approach can be realized by adjusting the current based on the I-V curve characteristics of the LED at the time of manufacture to compensate for any LED degradation and restore balance of the optical calibration matrix to avoid crosstalk between dye reporters. It is noted that a firmware/control unit of the system can modify the LED currents. Typically, this is done during system optical calibration in manufacturing and/or service, and not during an assay run.

In another aspect, the invention pertains to a diagnostic instrument that includes: a reaction vessel holding a fluid sample to be analyzed by an assay; a housing configured to receive the reaction vessel; an optical unit disposed at least partly within the housing, the optical unit including: an LED configured to provide an optical output for excitation of a prepared fluid sample within the reaction vessel; an optical detector configured to detect reactions in the prepared sample in response to optical excitation within an assay; and a control unit having a processor and a voltage sensor, the control unit configured to operate the LED to monitor the performance of the assay. In some embodiments, the control unit includes a processor with instructions recorded thereon for: monitoring a voltage across the LED during operation at a given current; correlating the voltage to a junction temperature of the LED such that the voltage is a proxy of the junction temperature; and determining an LED characteristic and/or photonic output based on correlation.

In yet another aspect, the invention pertains to an optoelectronic system that maximizes signal-to-noise in its photo-diode output, the system including: an LED-based excite block that illuminates a reaction-vessel, a detect block that receives optical information from the illuminated sample, and a control unit operatively connected to the excite block, detect block and ambient sensor, where the control unit includes a processor having instructions recorded thereon configured to: determine a normalized and filtered photodiode output whereby the normalization and filtering compensates for the influence of LED power fluctuation and LED temperature on a noise variance of the photodiode signal during illumination of the sample. In some embodiments, the excite block includes: an array of one or more LED; a constant current LED driver that, upon command, drives current into a specified element of the LED array; a voltage sensor that reads the LED voltage; and a temperature sensor that reads the excite block temperature. In some embodiments, the detect block includes: an array of one or more photodiodes, each with a transimpedance amplifier to convert the photodiode current to a voltage; a multiplexor to output a select photodiode voltage output; and a temperature sensor that measures the ambient temperature in the proximity of the reaction vessel. In some embodiments, the LED voltage measurement is a proxy for the LED junction temperature, which obviates the need for temperature input from the excite block. Accordingly, in some embodiments, the normalized and filtered photodiode output is determined without any temperature sensor input. In some embodiments, correlation between the LED electrical power and the photodiode signal is a substantially linear correlation and the observed correlation characteristic is a slope.

In some embodiments, the invention includes a diagnostic assay system adapted to receive an assay cartridge (also referred to occasionally as a "sample cartridge" or "test cartridge"). Such systems can include any one or combination of the various features and subassemblies described in U.S. Non-Provisional patent application Ser. No. 15/217, 920, as well as those described in U.S. Pat. Nos. 6,374,684; 6,818,185; 8,048,386; 8,187,557; and 8,119,352, each of which incorporated herein by reference in their entirety.

Some embodiments of the invention relate to a diagnostic device which can include a Thermal Optical Subassembly ("TOS") which comprises a thermal control device component and an optical excitation/detect component. In some embodiments, the thermal control device includes a thermo-electric cooler ("TEC") component that performs thermal cycling of a reaction vessel. In some embodiments the thermal control device is a resistive heater. The optical component excitation/detect component performs excitation and optical detection for a target analyte with improved control, rapidity and efficiency. In some embodiments, the TOS includes mounting components for interfacing the thermal control device with the optical component and defines a cavity for receiving a reaction vessel having a prepared fluid sample for performing an assay for a target analyte. In some embodiments, the mounting components provide the thermal control device and optical component in proximity to the reaction vessel so as to perform thermal cycling for amplification, excitation and optical detection of the target analyte simultaneously or in rapid succession. In some embodiments, the reaction vessel comprises a micro-array or a plurality of separate reaction wells and/or a pre-amplification chamber within the reaction vessel. In some embodiments, the TOS includes one or more mechanisms that move the thermal control device so as to pressingly engage at least one surface of the reaction vessel when positioned within the diagnostic device so as to improve efficiency of thermal cycling. In some embodiments, the TOS is integrated with one or more printed circuit boards (PCB), processors and controllers so as to coordinate thermal cycling and optical excitation/detection according to a particular assay. In some embodiments, the TOS includes a sensor for detecting proximity of a reaction vessel or associated sample assay cartridge to facilitate positioning of the thermal control device and/or optical component relative the reaction vessel or operation thereof. Some embodiments include a control unit configured to measure a voltage of the LED of the TOS so as to facilitate any of: start-up check, performance evaluation, LED health assessment, performance optimization, and thermal compensation of temperature fluctuation to stabilize the photonic output and/or shorten intra-shot duration.

BRIEF DESCRIPTION OF THE DRAWINGS

FIG. 14 depicts a control circuit for the optical excitation utilizing a measurement of voltage across an LED in accordance with some embodiments.

DETAILED DESCRIPTION OF THE INVENTION

Figure 1A:
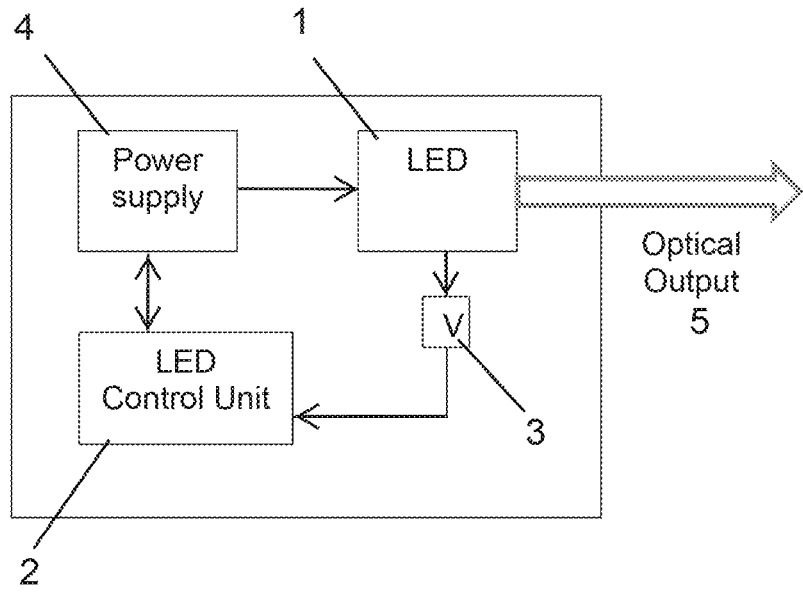
FIG. 1A is a schematic of an optical component of a system, according to some embodiments of the invention.

In one aspect, the invention pertains to systems having optical components with a light-emitting diode (LED), in particular diagnostic assay systems having such optical components and associated control systems to provide improved characterization and monitoring of the LED and/or improved performance of the LED by compensating for optical output fluctuations due to temperature. Such systems can include optical units with LEDs one or more wavelengths (e.g. UV, blue, green, yellow red, or any combination thereof).

Although LEDs are low power, robust, long life solutions, they do age and thus reliability is crucial. Therefore understanding the degradation mechanisms is important. Degradation is attributable to various factors, but primarily arises form electrical and thermal stress. Temperature fluctuations modulate emission intensity, and this correlation can be either positive or negative depending on the LED. Due to multiple factors at the semiconductor physics layer LED aging manifests as a change in the "resistance" as manifest in the I-V curve. Degradiation of photonic output in LEDs due to aging can be further understood by referring to the article: *Sovannarith Leng. Identifying and evaluating aging signatures in light emitting diode lighting systems. Electric power. Université Paul Sabatier—Toulouse III,* 2017. English. NNT: 2017TOU30035, incorporated herein by reference in its entirety. By utilzing the concepts described herein within firmware of diagnostic systems, the systems were able to sample coherently, and record in real-time, the photodiode (i.e. dye reporter) and the LED voltage signal. From Schottky's diode equation, the I-V diode relationship is strongly influenced by the LED junction temperature. By observing I-V characteristics in real-time, by utilizing the concepts herein, variations in the LED junction temperature can be compensated for without requiring any temperature sensor measurements. While some conventional systems may read the excite block temperature, this is not a true estimate of the junction temperature, but rather is only an approximation. Accordingly, the block temperature sensor can be eliminated as voltage across LED measurement is a much more precise and real-time approximation of the LED junction temperature. Thus, the concepts described herein allow for highly accurate determinations of the junction temperature of the LED, which can be used for monitoring the health of the optic system and extending the life of the system while providing improved signal to noise of the LED signal (i.e, the photonic output of the LED).

I. LED Voltage Measurement/Monitoring

As referred to herein, the "LED voltage" refers to the voltage across by the LED to operate at a fixed current. Due to various factors, including variations in temperature at the LED junction, the forward voltage of LED ($V_f$) at a fixed current fluctuates, which causes changes or degradation of the photonic output of the LED during the operation. This leads to more prolonged shots when performing an assay to ensure that a desired photonic output is produced for a sufficient time period to allow excitation/detection of the target analyte, which in turn shortens the useful life of the LED. Because of the scale and location of the LED within most systems, the temperature of the LED cannot be measured directly, and systems that account for variations in LED temperature actually utilize temperature measurements at other locations, which are limited in their usefuleness.

A. LED Health/Performance

In a first aspect, the invention provides methods and systems that facilitate measurement of LED voltage, which can be utilized to inform characterization and/or operation of the LED. The voltage measurement can be considered a proxy for the temperature of the junction of the LED, since photonic output is proportional to the current. By measuring the voltage of the LED, when the voltage changes in order achieve the same current, this means the temperature has changed, which in turn, causes photonic output change. Thus, measurement of the voltage, or changes in voltage can be correlated to the temperature or temperature change of the LED. Thus, this measurement can be used to account for these changes, for example precisely compensating for the LED intensity loss and effectively increasing the signal/noise of the LED output. In some embodiments, a voltage sensor of 12-bit resolution (e.g., $\frac{1}{10}$ of a volt) or greater can be used as this is sufficient resolution to provide a smooth voltage response that can be used to correlate with the photodiode response, allowing a reduction of the noise-to-signal ratio by two to ten times. The LED voltage signal can also be used for periodic monitoring of the LED health over time based on the voltage measurement based on I-V characteristics.

In some embodiments, the LED voltage measurements are fed into the I-V curve of the respective LED, which allows for the LED to be characterized, such as during a self-test, or monitored periodically or continuously during operation. In some embodiments, determining I-V characteristics at t=0 (e.g. time of manufacture), allows for monitoring of instruments in the field by merely measuring the I-V characteristics during a self-test. A self-test can be performed every time the system is powered on. A change in resistance signifies the LED device is wearing out. Measuring I-V and optical characteristics at t=0 and comparing to results in field are important in determining LED characteristics and LED health. In some embodiments, the voltage measurement can be used for initial characterization or calibration of the LED within the system.

B. Magnification of LED Voltage Measurements

In a second aspect, the invention provides a means by which the LED voltage can be magnified to increase the degree of resolution of the voltage measurement, higher than standard voltage measurements used for LED control and well beyond the standard resolution provided by the voltage sensor. This aspect can be utilized for any application of LED voltage measurements, including but not limited to LED characterization, start-up assessment, LED heath and life-span assessments, improving LED performance, and LED operation optimization.

In some embodiments, the system is configured to magnify a select sub-set of the entire operating range of the LED, typically bounding a target voltage for a desired operation. For example, the entire range of voltage for operating a given LED may fluctuate from 0 V to 12V, with 12V being the standard voltage for operating the LED under standard conditions to achieve the desired photonic output, which can include a desired intensity and/or wavelength. However, as noted above, as temperatures vary and photonic output changes, the actual voltage of the LED during operation may fluctuate above and below this standard value, for example between 11 and 13V. Therefore, it may be desirable to measure the voltage near the standard voltage value with a higher degree of resolution. By measuring the voltage in this region with a higher resolution, the performance of the LED can be more closely monitored and further optimized to account for relatively small changes in voltage (e.g., +/−0.1

V) that would otherwise not be detectable with a standard LED control and voltage sensor.

In some embodiments, magnification of a selected range of the voltage measurement is achieved by amplifying and processing the signal. In some embodiments, the system amplifies the signal with a differential amplifier of the control unit that receives the voltage, which is scaled down into a range that a programmable system on a chip (PSoC) can process, then a microprocessor outputs a voltage within the selected range that it uses to compare to the LED voltage reading measurement, taking the difference and multiplying that by a high-gain. This allows the control unit to measure very small changes in voltage that can be corrected by microprocessor to look at nominal voltage such that the microprocessor can output a voltage corresponding to the selected region of interest and then amplify it, thereby effectively magnifying the voltage measurement in the selected range. This can be used with the health monitoring described previously and is particularly advantageous when utilizing the voltage measurement for thermal compensation, as described below.

C. Thermal Compensation to Optimize LED Output/Performance

In a third aspect, LED voltage measurements can be used in real-time to provide feedback that reduces the noise in favor of signal. This can be used in optimizing LED performance and extending LED life. Changes in LED output due to thermal fluctuations can be compensated for by utilizing high resolution voltage measurements of the LED. In some embodiments, thermal compensation based on the measured LED voltage can be used to improve LED performance by improving the photonic output signal integrity and by reducing intra shot fluctuations. In some embodiments, this thermal compensation approach can be used to reduce LED die temp fluctuations.

Measuring LED voltage at the reference intra-shot current serves as a proxy for the junction temp rise that causes the change in photon emission. Using as feedback shot-to-shot microsecond level resolution readings, allows for real-time compensation for fluctuations of LED output during intrashot operation. This allows to increase number of shots, decreasing shot time, and reduce exposure time of LED. This approach can be used for calibration as well.

This thermal compensation approach allows for two key advantages. First, it reduces LED on-time (shot), which reduces the LED junction temperature rise (e.g. 1.5 msec versus 13 msec on-shot time) that impacts the photon emission rate and spectrum. Further, lower operating temperatures increase design life-span. Second, thermal compensation can be performed in real-time during the optical read, thereby stabilizing the LED photonic output signal (and thus dye reporter signal) in a way that greatly reduces the signal fluctuation (e.g. by three to five times) for select channels. Algorithms embodying these aspects can be encoded into the control unit of any suitable LED component, for example, a diagnostic system having an optical unit with an LED that delivers pulses to monitor performance of an assay, as described further below.

It is appreciated that an LED system can include one or more of the above described approaches. These algorithms can be utilized in testing and diagnostic equipment to assess and check the performance of existing systems, or can be integrated within the systems themselves to perform diagnostics, optimize operation to improve performance or life span, and/or to estimate life-span of optical components to accommodate replacement or upgrades of components. System that utilize LED components that can benefit from these concepts include, but are not limited to: biological assay testing systems, chemical processing and testing systems, industrial processing equipment, medical therapy systems, visual display systems, and computing systems.

II. Exemplary System

A. System Overview

FIG. 1A depicts a schematic of the optical component, which includes at least an LED 1 configured to emit an optical output signal 5, a control unit 2 communicatively coupled with a power supply 4 and a voltage sensor 3 that measures the LED voltage, as described previously to measure the health of the LED and/or for use in optimizing the optical output 5. The control unit includes a processor having a memory with instructions recorded therein to obtain the LED voltage measurement and perform any of the functions described herein. This optical component can be incorporated into a diagnostic system such that described below.

Figure 1B:
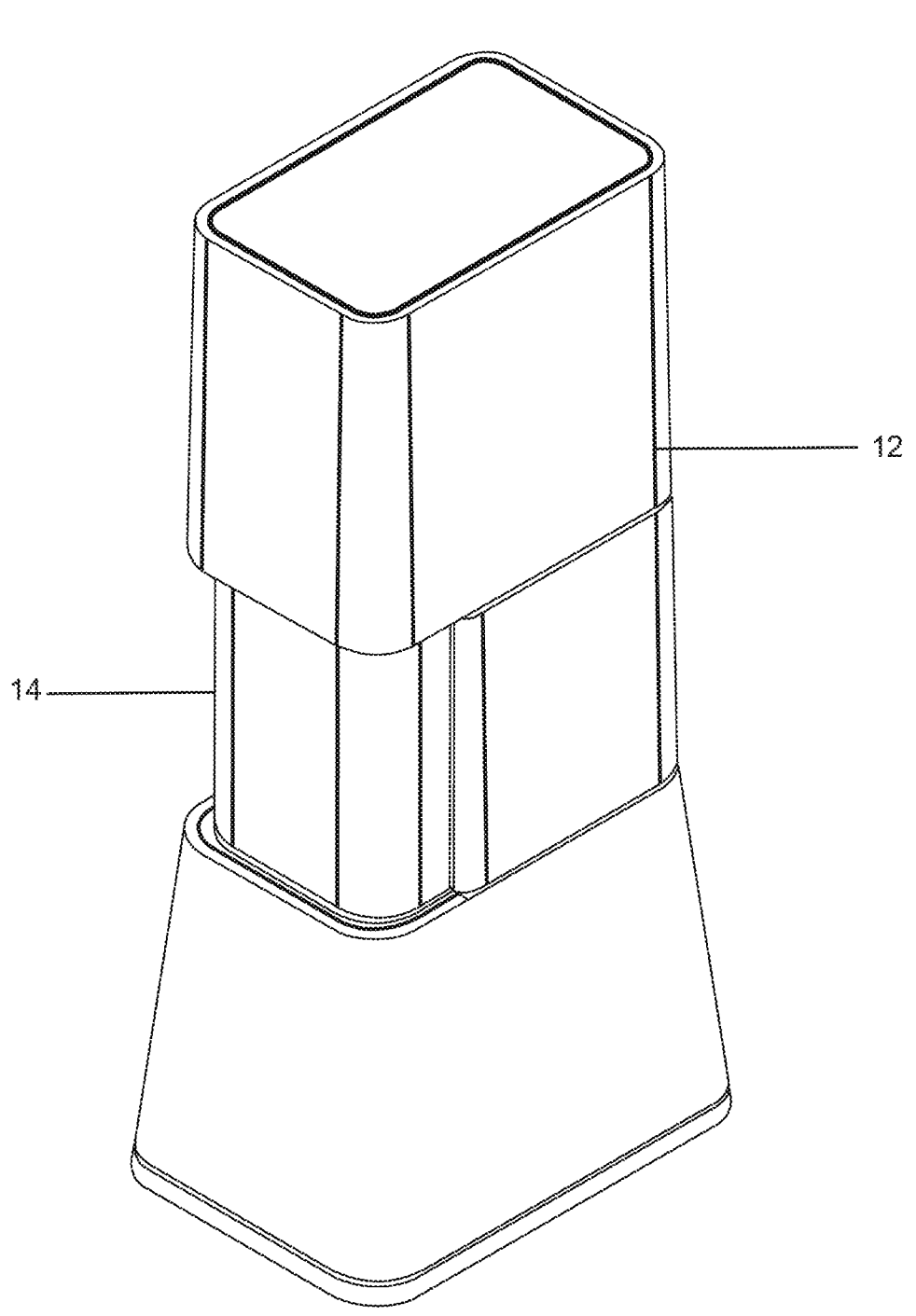
FIG. 1B is a perspective view of a diagnostic assay system having an optical component, according to some embodiments of the invention.
Figure 1C:
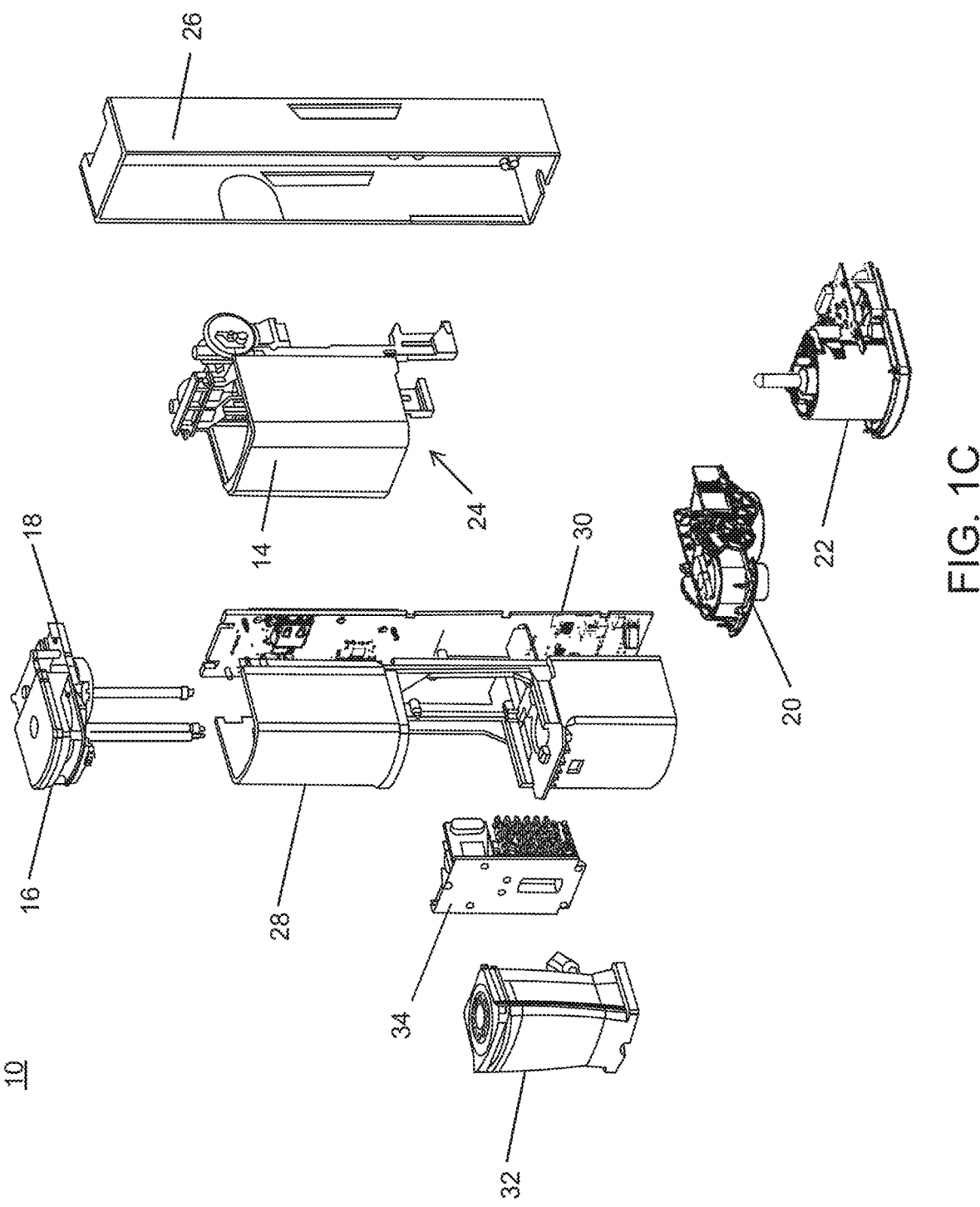
FIG. 1C is an exploded view of a diagnostic assay system having an optical component, according to some embodiments of the invention.

FIG. 1B shows a perspective view of a non-limiting exemplary diagnostic assay system 10 for testing a biological sample, according to some embodiments of the invention. The compact form factor of the system 10 provides a portable sample testing device that can communicate wirelessly or directly (wired) with a local computer or cloud-based network. As such, the system 10 can be advantageously used for point-of-care applications including mobile diagnostic centers, in emerging countries, and in physician office labs.

The system 10 is usable with a disposable assay cartridge, which is configured to accept a biological sample and adapted for performing a particular assay. The system and cartridges are highly flexible and can be used to detect a variety of analytes, including nucleic acid and protein. Non-limiting exemplary analytes that can be detected using the system and assay cartridges includes, bacteria, viruses, and disease specific markers for a variety of pathogenic disease states including Health Associated Infections (MRSA, *C. difficile*, Vancomycin resistant enterococcus (VRE), Norovirus), Critical Infectious Diseases (MTB/RIF, Flu, RSV, EV), Sexual Health (CT/NG, GBS), oncology (e.g., breast or bladder cancer) and Genetics (FII/FV). Once an assay cartridge is physically inserted within and initialized by the system 10, the system will perform the functions of specimen processing, which can in some embodiments include sample preparation, nucleic acid amplification, and an analyte detection process.

The system 10 can be powered by an external power source, but can feature an uninterruptable power supply (e.g. batteries) in case of power disruption or field use. The uninterruptable power supply (UPS) allows for field use of the system, and in some embodiments can provide power to the system for at least one day, preferably up to two days. In some embodiments, the UPS allows for up to four hours of continuous operation. As shown in this external view, the system 10 can include an outer shell 12 and a door 14 for accepting an assay cartridge (not shown). Different styles of the outer shell 12 can be configured as needed by a particular user. Typically, outer shell 12 is formed of a substantially rigid material so as to protect and support the components within, for example, a hardened polymer or metal construction. Although not shown here, in some embodiments the outer shell 12 can be heavily ruggedized (armored) for field use, or as shown here made decorative for physician office use.

FIG. 1B shows an exploded view of the system 10 (without the outer shell) and with major subsystems depicted outwardly. The system can include various subsystems, such as any of those described in U.S. application Ser. No. 15/217,920, incorporated herein by reference. It is appreciated that this is but one example of a diagnostic system that can utilize the invention described herein, and that any diagnostic instrument utilizing an LED optical component can benefit from using the concepts herein. It is further appreciated that these concepts are not limited to the field of diagnostics and is applicable to any application that utilizes an LED output. (e.g. medical diagnostics, medical therapeutic devices, industrial equipment, consumer products).

B. Thermal Optical Subassembly (TOS)

In some embodiments, the invention provides a Thermal Optical Subassembly (TOS) for use in a diagnostic assay system. In some embodiments, the TOS includes a thermal control device component and an optical excite/detect component. The TOS may interface with other components of the diagnostic assay system, which may include a cell lysing component such as an ultrasonic horn, a door, a fluid dispense and metering system (e.g., a syringe) and a valve. In some embodiments, the TOS includes a thermal control device instrument and an optical component instrument having an excitation means and an optical detection means. The TOS unit is constructed so as to define a cavity in which a reaction vessel can be inserted for performing nucleic acid amplification and/or detection of a target analyte using the thermal control component and optical interrogation of the target analyte using the optical component instrument. The TOS is employed in a system with one or more circuit boards (e.g. motherboard) that control operation and coordination between the various components of the assay system. In some embodiments, a Cell Core piggy backs onto the motherboard. In some embodiments, each hardware subassembly carries their own dedicated PSoC processor and associated electronics. In some embodiments, the diagnostic assay system includes a communication means (e.g. wireless, NFC, USB) that allows modification and/or updating of the control software or control parameters utilized by the system. The TOS can also include one or more sensors (e.g. NFC reader) to determine a location or presence of an assay cartridge or a position of the valve component so as to coordinate operation of multiple components of the system. In some embodiments, the TOS comprises a cartridge position sensor (e.g. NFC reader) located physically on the TOS to allow it to be physically in close proximity to the assay cartridge when inserted into the diagnostic assay system. In some embodiments, the TOS can be serially connected other electronic subsystems via USB and/or wireless interfaces like NFC or bluetooth.

B.1 TOS Design

It is appreciated that the thermal control device instrument and the optical detection device can be defined in various configurations, as desired. In the embodiments described herein, the thermal control and optical detection device is configured for use with a reaction vessel having two opposing major faces and two edges (minor faces). The thermal control device can be configured for one-sided heating of one major face of the reaction vessel, or two-sided heating of both the major faces. In the embodiments described herein, the thermal control device is configured to be positioned adjacent a major face of the reaction vessel on one or both sides. Likewise, the optical detection detection device can be configured according to various configurations, such as optical detection from a major face of the reaction vessel or from one or more edges (minor face(s)) of the reaction vessel. Typically, the optical detection configuration corresponds to a configuration of the thermal control device, for example, the optical detection device is positioned to detect optics through a part of the reaction vessel not covered by the thermal control device. In some embodiments, where one sided heating is used, the opposing non-heated major face can be covered with a transparent insulating material so as to control heat transfer while still allowing for optical detection through the insulating material. In some embodiments, the system utilizes a thermal control device configured for one-sided heating and an optical detection device configured for excitation/detection from a major face and/or one or more edges (minor face) of the reaction vessel. In other embodiments, the system utilizes a thermal control device configured for two-sided heating with an optical detection device configured for optical excitation/detection from one or more edges of the reaction vessel. Exemplary configurations are provided below.

Figure 2:
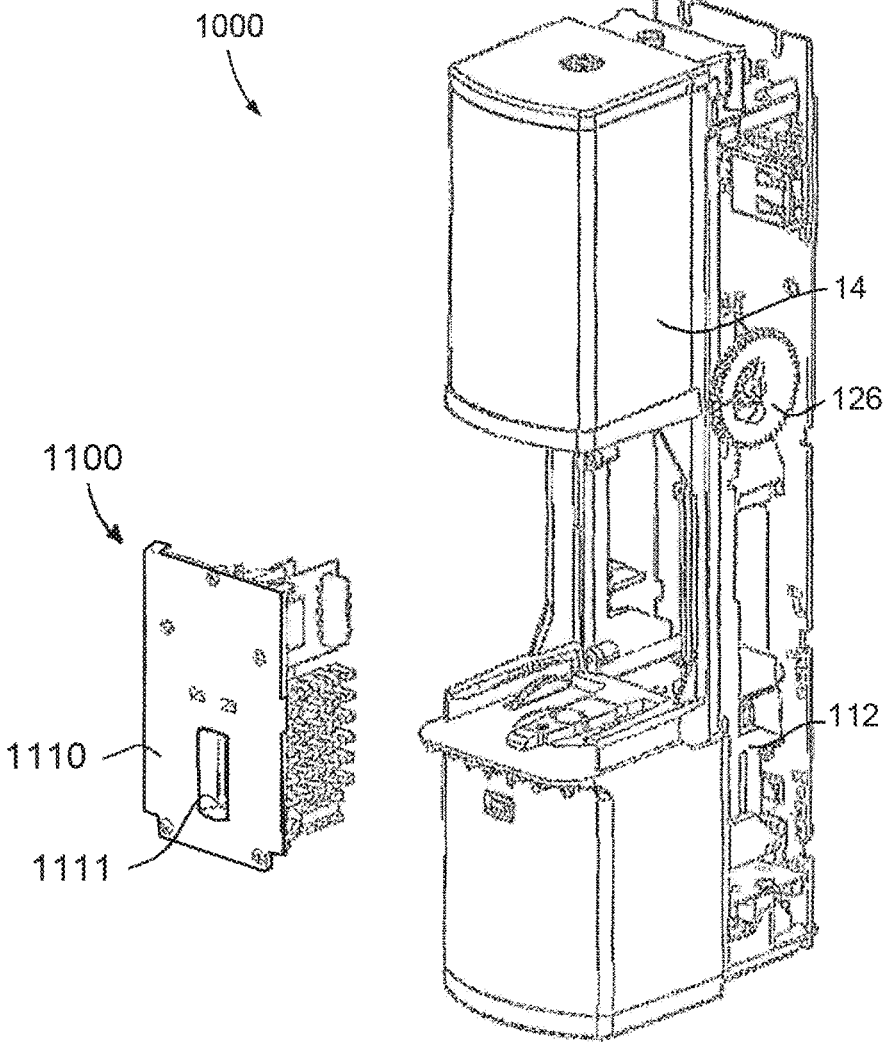
FIG. 2 illustrates an exemplary TOS sub-assembly before insertion into the assay module in accordance with some embodiments of the invention.

FIG. 2 shows an exemplary diagnostic assay system 1000 for performing detection of a target analyte in a fluid sample prepared within a disposable assay cartridge (not shown) when inserted into the system. The diagnostic assay system 1000 includes multiple components and subassemblies, as described herein, one of which is the TOS subassembly 1100. As shown in FIG. 2, the TOS 1100 subassembly can install from the front of the system. The TOS can be inserted into the frame or housing of the system 1000 with the door 14 open and secured with one or more screws (not shown) so that the front plate 1110 faces into the receptacle of the system that receives the assay cartridge. The front plate 1110 defines a cavity opening or slot 1111 through which a planar reaction vessel of an assay cartridge can be inserted. In some embodiments, the TOS can be tested as a stand-alone sub-assembly before insertion into the diagnostic assay system. In some embodiments, the TOS can be removed or replaced as needed.

In some embodiments, the diagnostic assay system uses a disposable assay cartridge. An exemplary assay cartridge suitable for use with the system as described herein is described in U.S. Pat. No. 6,818,185, entitled "Cartridge for Conducting a Chemical Reaction," filed May 30, 2000, the entire contents of which are incorporate herein by reference for all purposes.

In some embodiments, the TOS slot 1111 and cavity is dimensioned so as to accommodate the reaction vessel, typically within +/−0.020", and the optical mount and associated components are adapted to locate the optical components relative to the reaction vessel to facilitate excitation and optical detection for the target analyte. In some embodiments, the TOS is spatially configured to locate a thermal control device, such as a dual-TEC device, relative to the reaction vessel to control and facilitate thermal cycling of the fluid sample within the reaction vessel of the assay cartridge. In some embodiments, the TOS moves the thermal control device, for example, retracting the dual-TEC before insertion of the reaction vessel and then engages and clamps the dual-TEC against the reaction vessel when in place.

Figures 3A, 3B:
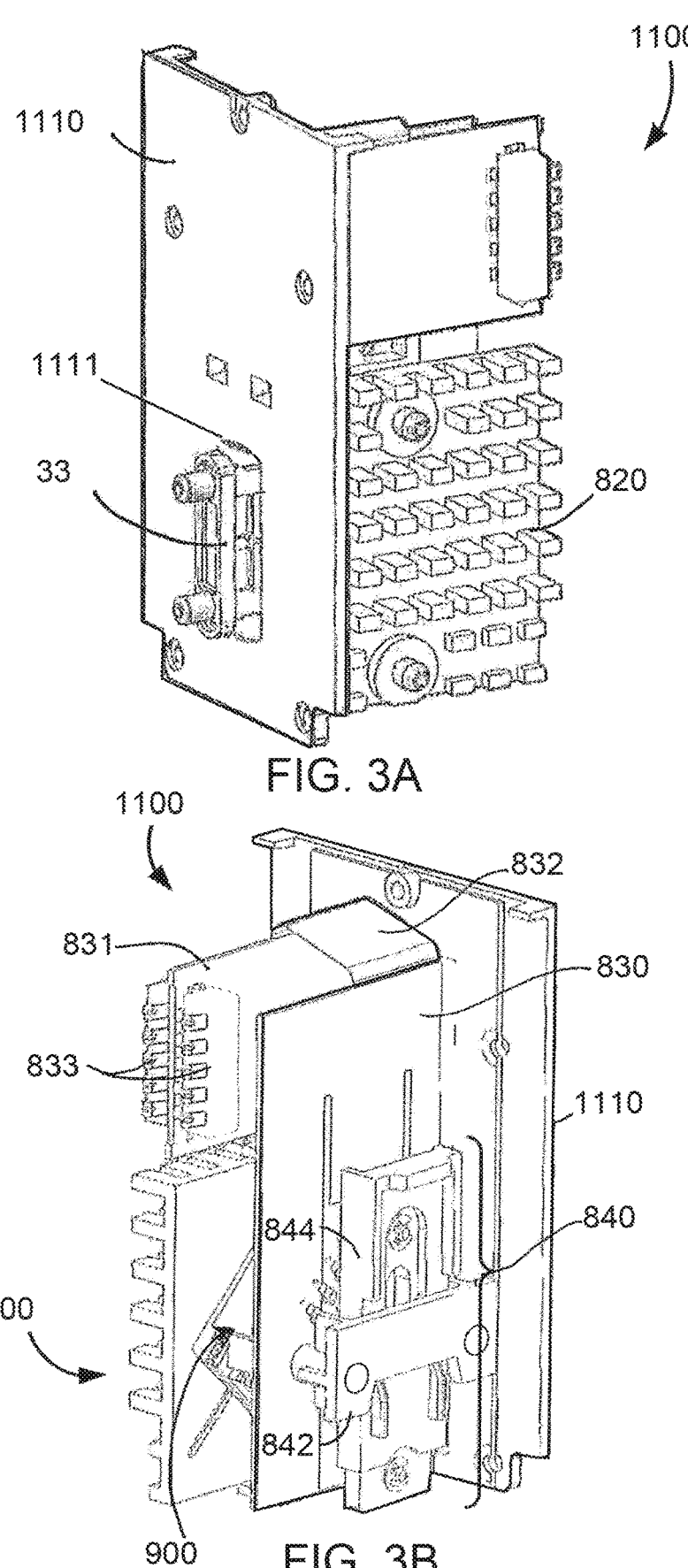
FIGS. 3A-3B illustrates front and rear views of an exemplary TOS sub-assembly in accordance with some embodiments of the invention.

FIGS. 3A-B illustrates front and rear views of an exemplary TOS sub-assembly 1100 in accordance with some embodiments of the invention. In FIG. 3A, an exemplary reaction vessel 33 is shown inserted into the cavity opening 1111 of the front plate 1110 and the thermal control mount/ heat sink 820 can be seen, as well as a cooling fan 822 (see FIG. 4B). In FIG. 3B, a rigid flex PCB configuration and thermal contact mechanism 840 allowing for lateral movement of the thermal control device prior to clamping engagement of the reaction vessel 33 can be seen. The PCBs 830 and 831 through which the thermal control device 800 and the optical component 900 are powered and controlled can be coupled through a rigid flex connection 832 that allows for lateral movement. Thermal contact mechanism 840 includes a slidable component that translates movement between an open configuration and a clamped configuration in which a TEC face 810 of the thermal control device is engaged against the side of a reaction vessel 33. In some embodiments, thermal contact mechanism 840 includes a movable and/or adjustable bracket 842 that can slide up and down along a vertically extending mount 844 to ensure proper alignment with the optical component 900 and the reaction vessel, and is movable laterally toward thermal the thermal control device to ensure suitable thermal contact with the reaction vessel 33 to facilitate efficient thermal cycling. In some embodiments, the thermal contact mechanism 840 includes a bottom support or guide 846 to facilitate insertion of the reaction vessel within the thermal contact mechanism 840.

Figure 4A:
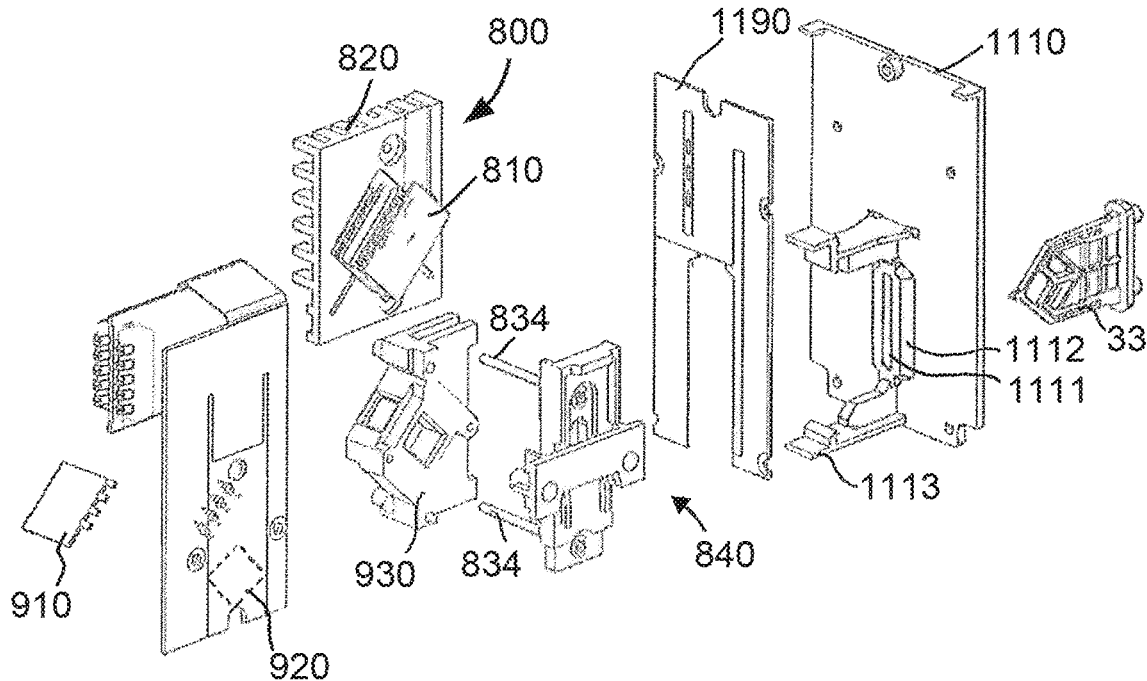
FIGS. 4A-4B illustrates exploded views of an exemplary TOS in accordance with some embodiments of the invention.
Figure 4B:
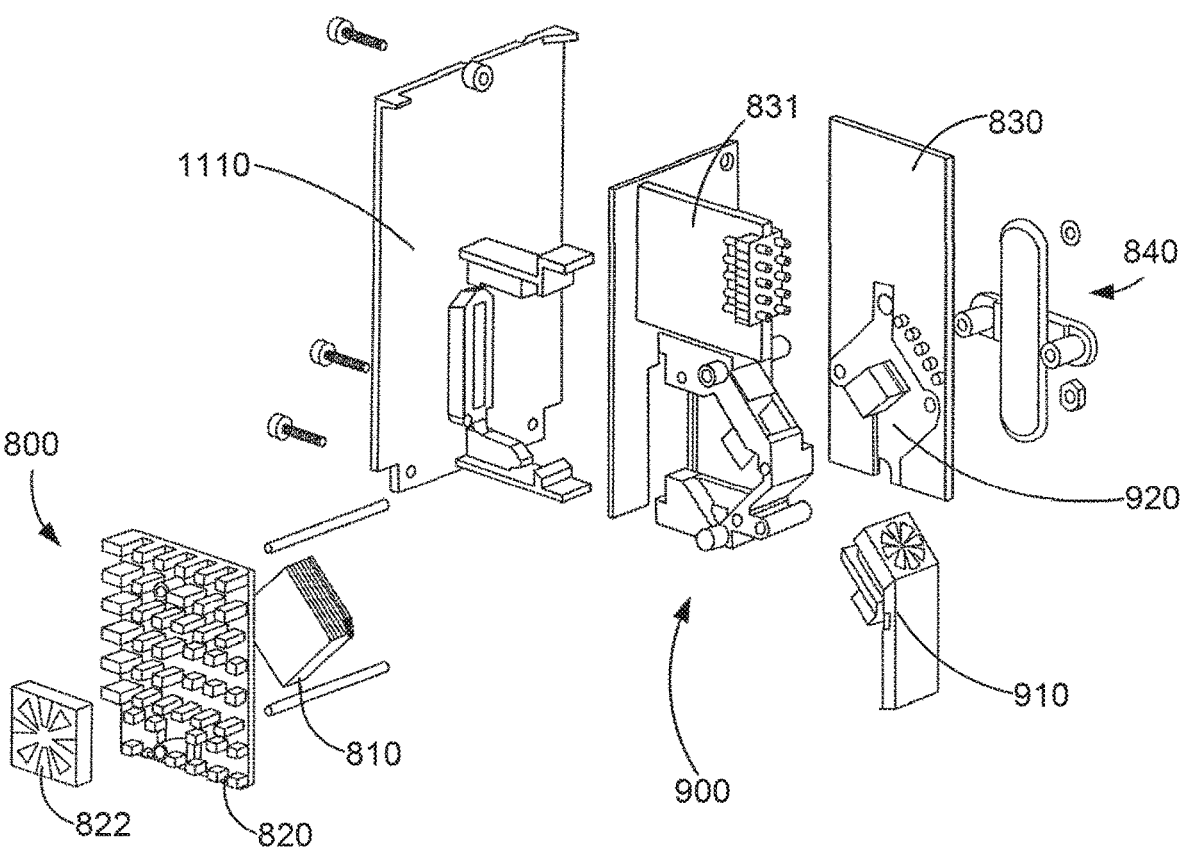

FIGS. 4A-4B illustrates exploded views of an example TOS in accordance with some embodiments of the invention. As can be seen, the TOS assembly includes an optical mount 930 having windows through which the excitation component 910 and optical detection component 920 can operate when assembled. The optical mount is attached to the front plate 1110 through a bracket 1113 and at least partly surrounds the flange 1112 around the reaction vessel opening 1111. The thermal control device 800 is coupled to the optical mount 930 by two pins 834 that extend through the thermal contact mechanism 840 and two holes through the optical mount 930. The assembly may also include a sensor for detecting a proximity location, or identity of the cartridge within the system. In some embodiments, the sensor is a near field communication (NFC) sensor 1190, although it is appreciated that various other sensors can be used. It is appreciated that, in some embodiments, the NFC can be adapted to detect various differing things, including but not limited to: the location/presence of a cartridge, the type of cartridge, the particular assay, the microfluidic procedures that are unique to a particular assay, the presence of a mobile device (e.g. PDA) and various other lot specific parameters. In some embodiments, the NFC allows for a work flow associated with a particular system/cartridge, thereby obviating the need for a separate database in the cloud that the diagnostic assay system would otherwise have to access. This feature is particularly useful in a resource limited settings where internet may not be readily available.

Figure 5A:
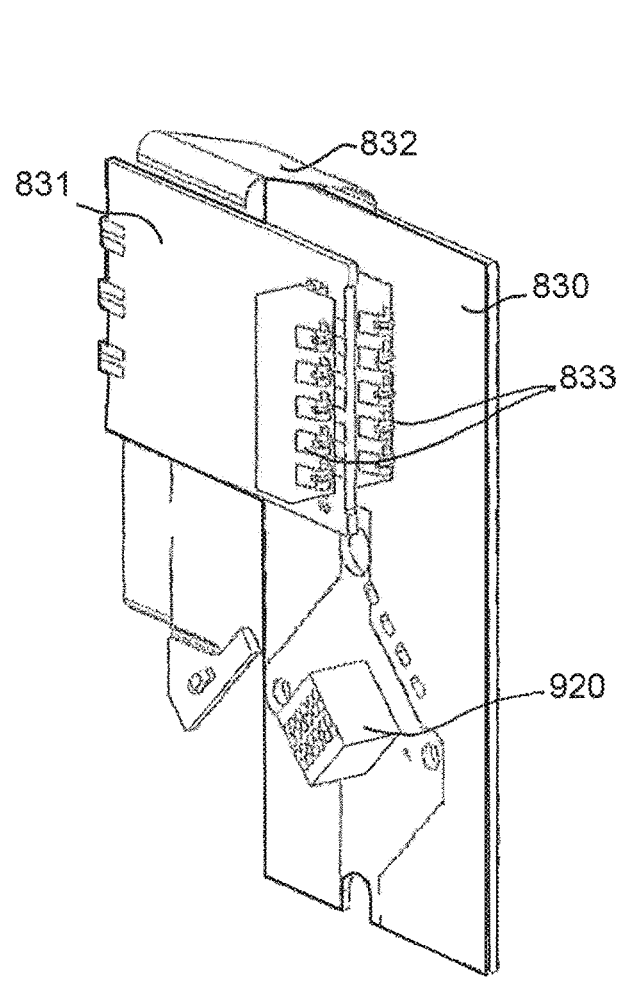
FIGS. 5A-5B illustrates optical components and associated PCBs of an exemplary TOS in accordance with some embodiments of the invention.
Figure 5B:
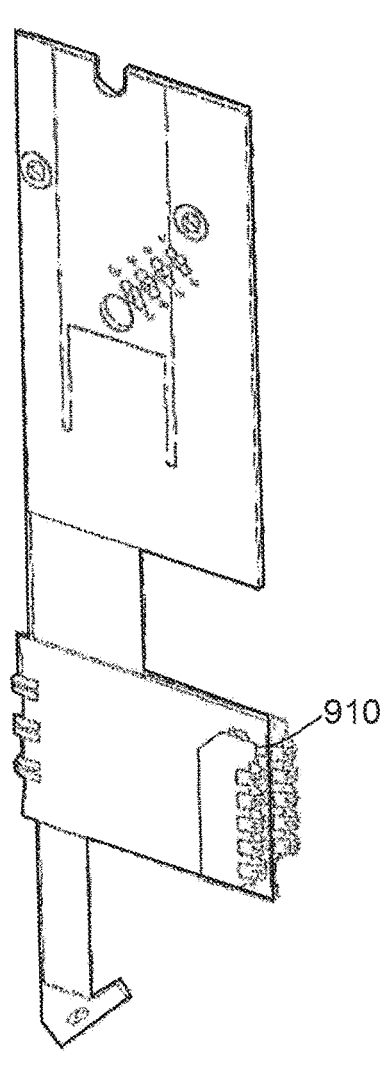

FIGS. 5A-5B illustrates optical components and associated PCB of an exemplary TOS in accordance with some embodiments of the invention. The optical components include an excitation component 910, an optical detection component 920 and associated PCB components 830, 831 and electrical circuitry 833. In some embodiments, the PCBs are connected through a rigid flex connection 832 that allows for lateral movement of the thermal control device against the reaction vessel.

Figure 6:
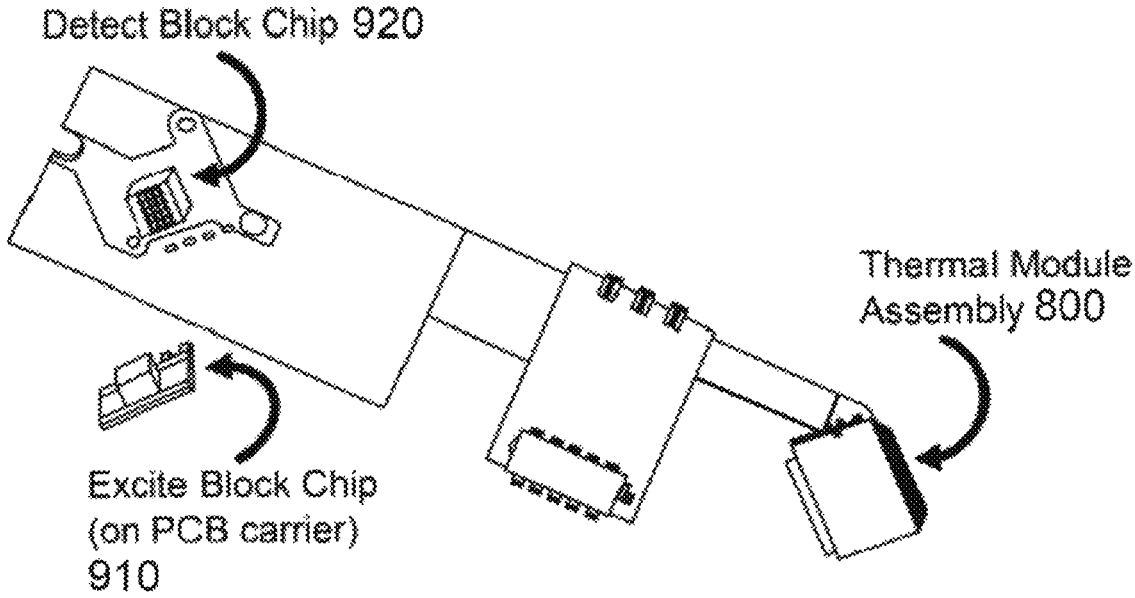
FIG. 6 illustrates an exemplary schematic of optical and thermal control components of the TOS in accordance with some embodiments of the invention.
Figure 7:
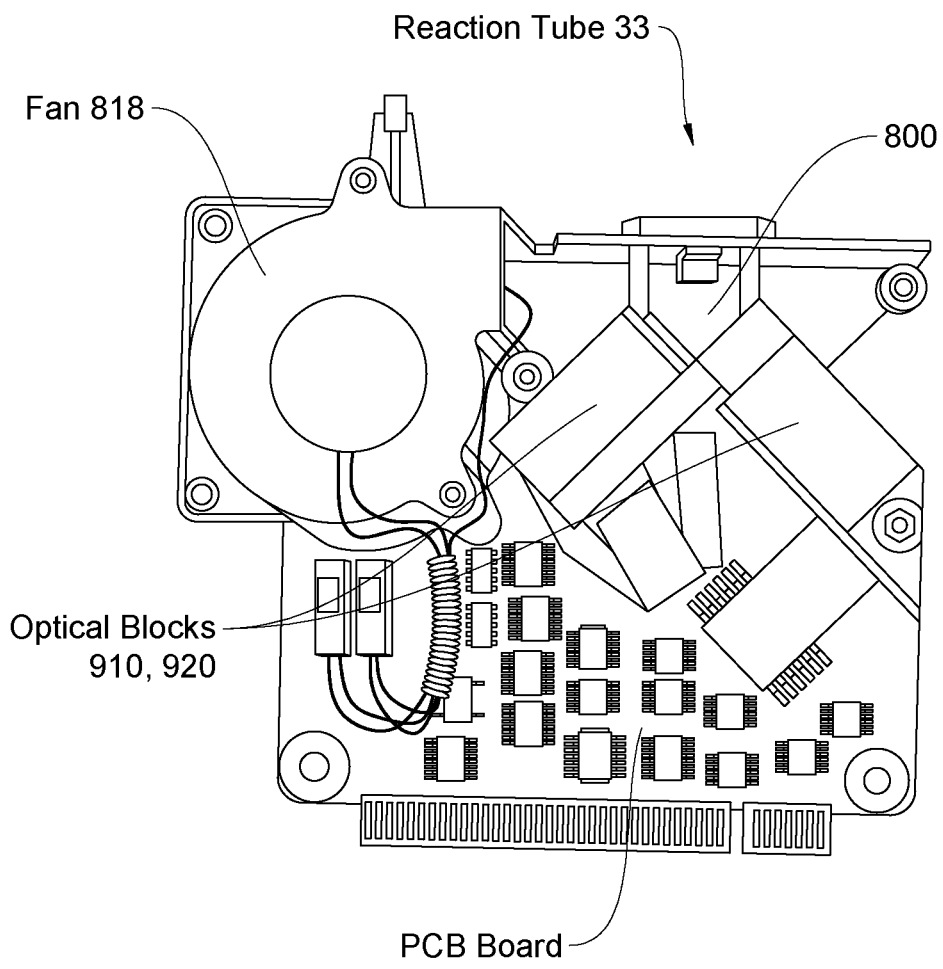
FIG. 7 illustrates an exemplary TOS for use in a diagnostic assay system in accordance with some embodiments of the invention.

FIG. 6 illustrates a schematic of the optics module and thermal module assembly 810 of the TOS in accordance with some embodiments of the invention. The optics module includes a detect block chip or detection component 920 and an excite block chip or excitation component 910 disposed on a PCB carrier. FIG. 7 illustrates an exemplary TOS for use in a diagnostic assay system as disclosed herein.

B.2 Optical Component

Figures 8A, 8B:
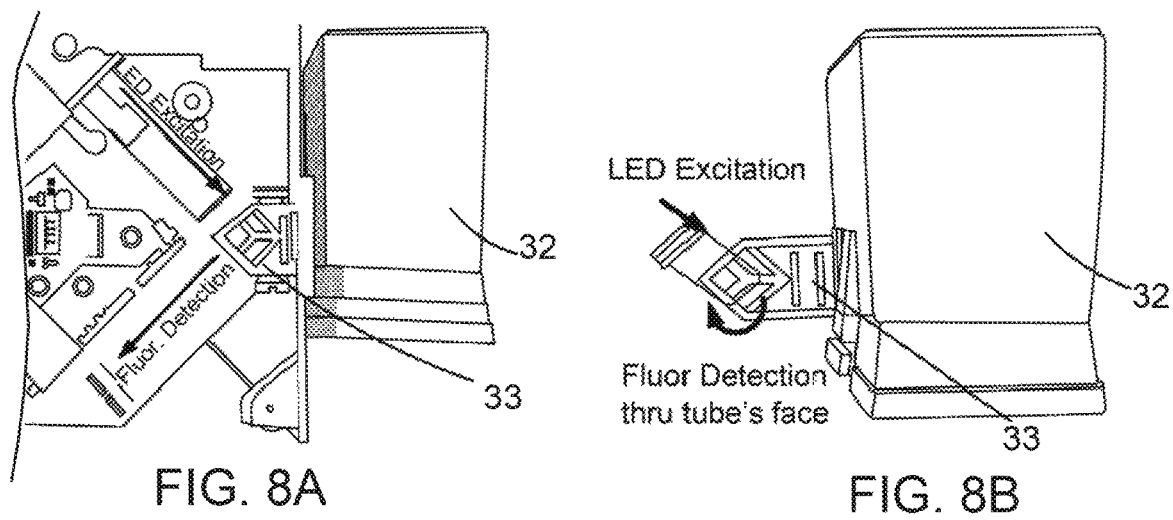
FIGS. 8A-8B illustrate two exemplary optical component configurations for use with a reaction vessel in a diagnostic device in accordance with some embodiments of the invention.

FIG. 8A illustrates an exemplary optical component configuration for use with a diagnostic assay system as disclosed herein and FIG. 8B illustrates a detailed schematic of an exemplary optical component configuration in accordance with some embodiments of the invention. In some embodiments, the optical excitation and detection means operate through a minor face (edge) of a reaction vessel of an assay cartridge while the thermal control device engages against one or more opposing major faces of the reaction vessel. In some embodiments, the thermal control device component thermally engages a major face of the reaction vessel on one side. In some embodiments, the thermal control device component thermally engages a major face of the reaction vessel on both sides. This latter configuration can be particularly useful for heating and cooling of larger fluid sample volumes. Such configurations can use ceramic plate heaters to heat and passive cooling (e.g. ambient air blown across the ceramic heaters) means to achieve the thermocycling of the fluid in the reaction vessel or can include any of the TEC configurations described herein.

Figure 8C:
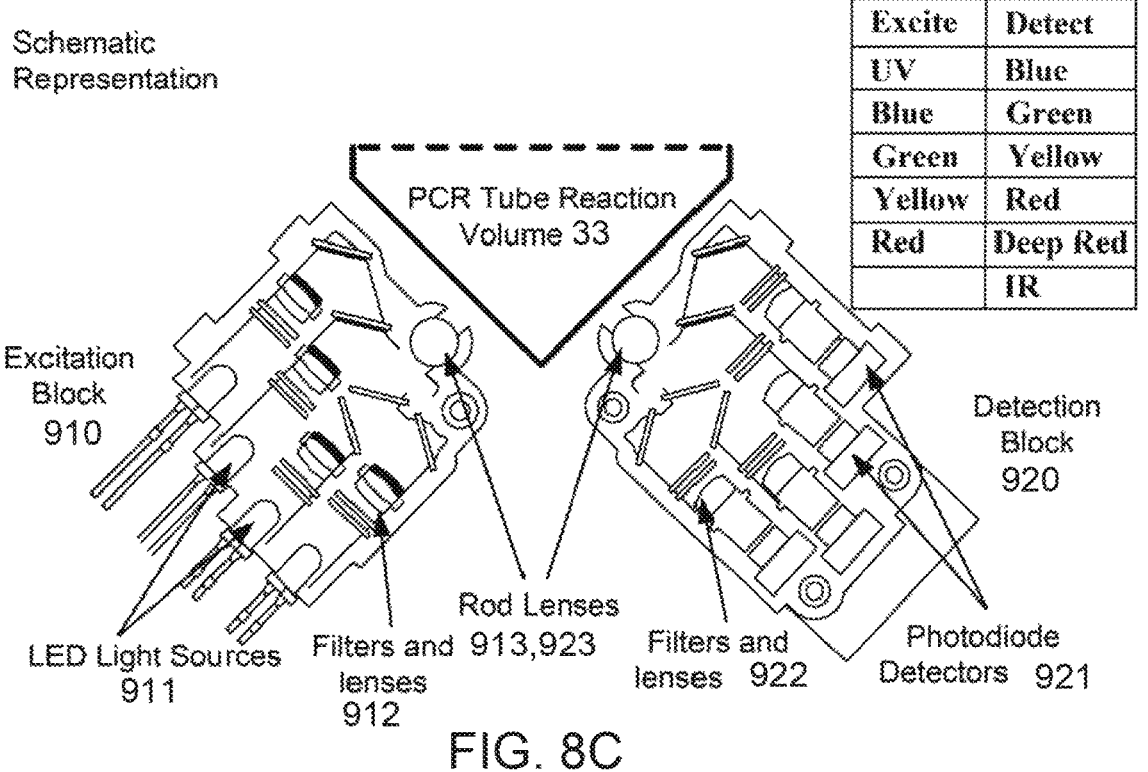
FIG. 8C illustrates a detailed schematic of an exemplary optical component configuration in accordance with some embodiments of the invention.

In accordance with some embodiments of the invention, a miniaturized LED excite chip that can excite the fluid sample through a minor edge of the reaction vessel, while a miniaturized detect chip collects fluorescence through a major face of the reaction vessel 33, as in the configuration shown in FIG. 8B. In addition, the dual TEC design provides controlled heating and cooling through the opposite face, which provides improved temperature control as compared to passive cooling as used in some thermocycling devices. In some reaction vessels, such as the configuration in FIG. 8A, edge-looking windows are narrow (e.g. about 1.0 mm×4.5 mm) and the small size makes traditional lensing difficult. Collecting fluorescence from a major face of the reaction vessel, as in FIG. 8B, provides a larger detection window that allows for more signal to be collected while still allowing excitation and detection to be orthogonal to each other. In some embodiments, the optical detection chip is sized to match the reaction vessel dimensions. FIG. 8C illustrates detailed view of each of an exemplary excitation block and a detection block in accordance with some embodiments of the invention. As shown, excitation block 910 includes LED light sources 911 that direct light through filters and lenses 912 and then rod lenses 913 so as to emit the desired wavelengths of light to the desired locations of the reaction vessel 33. The optical detection block 920 includes photodiode detectors 921 that detect light emitted from the reaction vessel 33, the emitted light passing through rod lenses 923, and filters and lenses 922 before being received by the photodiode detectors 921 so as to ensure detection of particular wavelengths that may indicate a reaction that corresponds to presence of the target analyte within reaction vessel 33.

In some embodiments, the optical component 900 includes an optical excitation component 910 and an optical detection component 920 positioned on an optical mount adapted to receive a planar reaction vessel 33. The optical excitation component 910 is positioned to emit excitation energy through an edge (minor face) of a planar surface of the reaction vessel 33 and the optical detection component 920 is positioned along a major planar surface of the reaction vessel. In one aspect, the optical excitation and optical detection components are orthogonal relative each other. In some embodiments, the optical components are configured to utilize lenses with a high numerical aperture. In some embodiments, the optical components are configured for operation at low numerical apertures without requiring use of lenses. In such embodiments, the light path may travel from the source, through a filter and to the detection component without requiring use of lenses to focus the light produced by excitation. Such embodiments can be configured such that the excitation and detect light paths are spatially arranged relative each other to improve detection of light produced by excitation at low numerical apertures without requiring use of lenses. Such use of spatial discrimination in detecting of excited light allows for light detection without lenses, which allows for a system of reduced size.

In fluorescent detection systems, the excitation light typically exceeds the amount of the emitted fluorescent light signal. In order to efficiently detect the emitted signal it is important to collect as much emitted light as possible. Thus, most conventional systems employ a high numerical aperture in their optical detection systems. A high numerical aperture allows for collection of more light, which in turn provides for greater resolution, while a low numerical aperture typically results in the collection of less light resulting in a lower resolution. Most conventional fluorescent optical detection systems use a configuration involving a lens and a band pass filter in the light path between the light source and the detector. The filter is typically placed between the lens and the detector such that the lens provides for collimated light passing through the filter. In the absence of a lens (and collimated light) the filter becomes much less efficient as light of high incident angles striking the band pass filter merely passes through unfiltered. The lens obviates this problem as it collimates (reducing the high incident angle beams) resulting in more efficient filtering of the excitation wavelengths.

In some embodiments of the present invention, the optical system does not include a lens. In the absence of a lens, a low numerical aperture configuration is used with the light path consisting of just the light source, a band pass filter and the detector. Using a low numerical aperture with this configuration reduces the high incident light angles (without using a lens) thus improving the efficiency of the filtering which in turn results in a strong signal of emitted light with most of the excitation wavelengths filtered out.

In some embodiments, the optics module includes UV, blue, green, yellow and red LEDs, relevant optical filters, coupling optical elements and protective glass. In some embodiments, the optics device is fully encapsulated in epoxy, which provides protection from shock and protects against dust and moisture incursion. In some embodiments, the optics excitation and detection chips are of reduced size, such as less than 10 mm in each dimension, typically about 5 mm (l)×4 mm (w)×3 mm (h).

Figure 9:
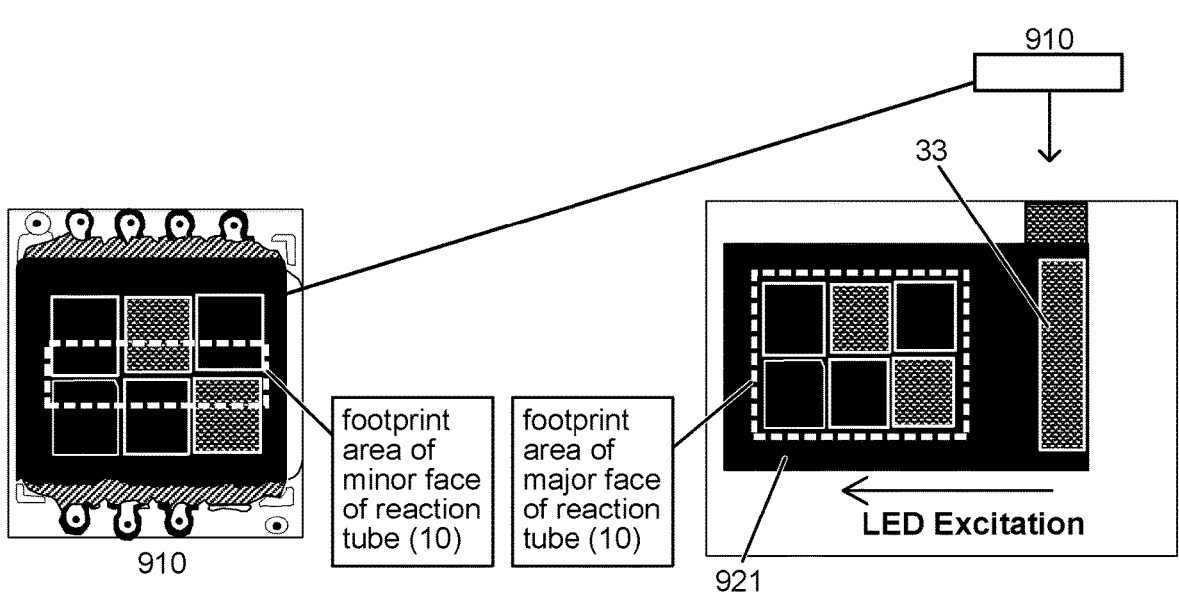
FIG. 9 illustrates exemplary detailed views of the excitation block and the detection block in accordance with some embodiments of the invention.

FIG. 9 illustrates detailed views of the excitation block 910 and the detection block 920 with an indication of the relative area of the adjacent reaction vessel through which light is emitted from the excite block and collected by the detect block.

Figure 10:
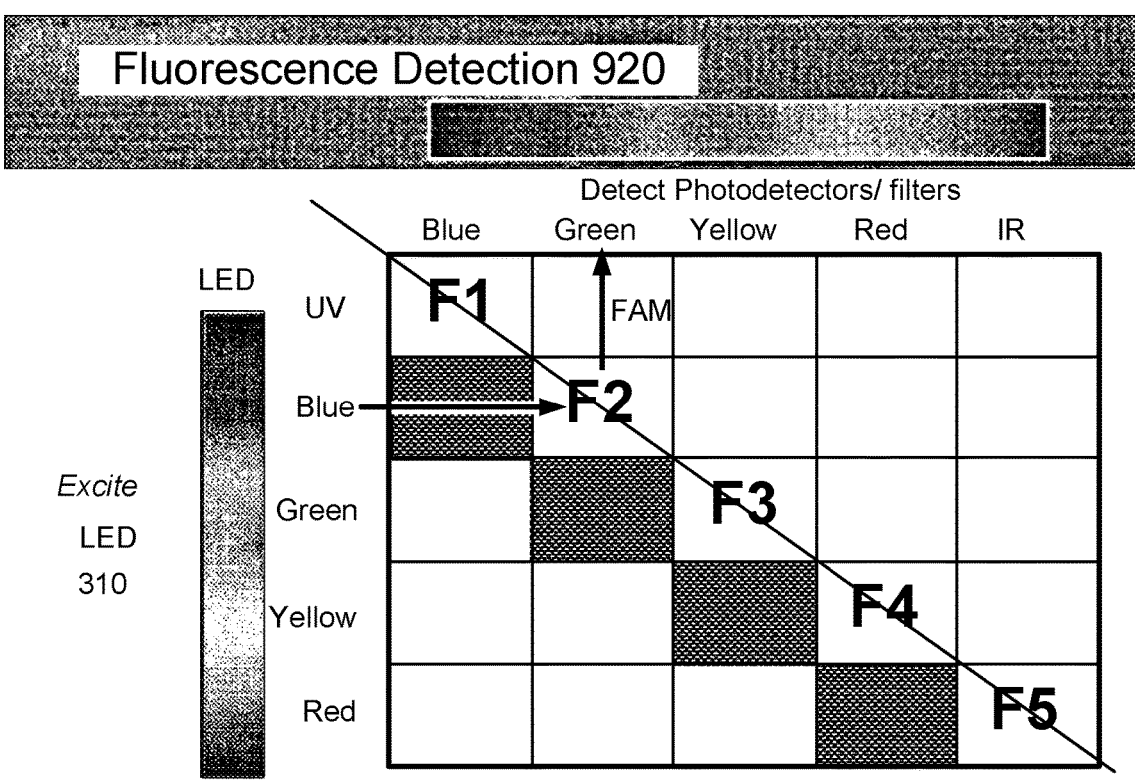
FIG. 10 illustrates fluorescence detection with the excitation and detection components of an exemplary optical component in accordance with some embodiments of the invention.

FIG. 10 illustrates fluorescence detection with the excitation and detection components of the optical component in accordance with some embodiments of the invention. As can be seen, the configuration in FIG. 10 matches the arrangement pattern for the excitation and detection blocks which relates to the use of the low numerical aperture, in accordance with some embodiments. This demonstrates the need for a reliable photonic output of the LED within the desired spectrum, in order to perform precise excitation/detection of a particular dye report signal to allow detection of a given target analyte at high confidence levels.

Although particular hardware and software components are described with respect to the disclosed embodiment, a person of ordinary skill in the art will recognize that, in some embodiments, some such components can be substituted, replaced, omitted, and/or otherwise altered as compared to other embodiments. For example, the PSOC can be replaced with multiple components to provide substantially the same functionality. A person of ordinary skill in the art will be familiar with various mixed signal and/or analog microcontrollers that are suitable for use with the invention. Representational State Transfer (REST) interfaces may be replaced and/or used in conjunction with other software structures and/or protocols where appropriate, such as Create, Read, Update and Delete (CRUD); Domain Application Protocol (DAP); Hypermedia as the Engine of Application State (HATEOAS); Open Data Protocol (OData); RESTful API Modeling Language (RAML); RESTful Service Description Language (RSDL); and the like. In some embodiments, the Epsilon Xpert Reporter Software operates as a client of the Remote Xpert Software and runs on the Cellcore processor of the Epsilon instrument Hardware in the same JVM as the Epsilon Instrument Interface Software. The Epsilon Instrument Hardware can be the physical subsystem that performs assays. In some embodiments, this subsystem may only include the hardware of the instrument, with the software running on the instrument as a separate subsystem.

Figure 11A:
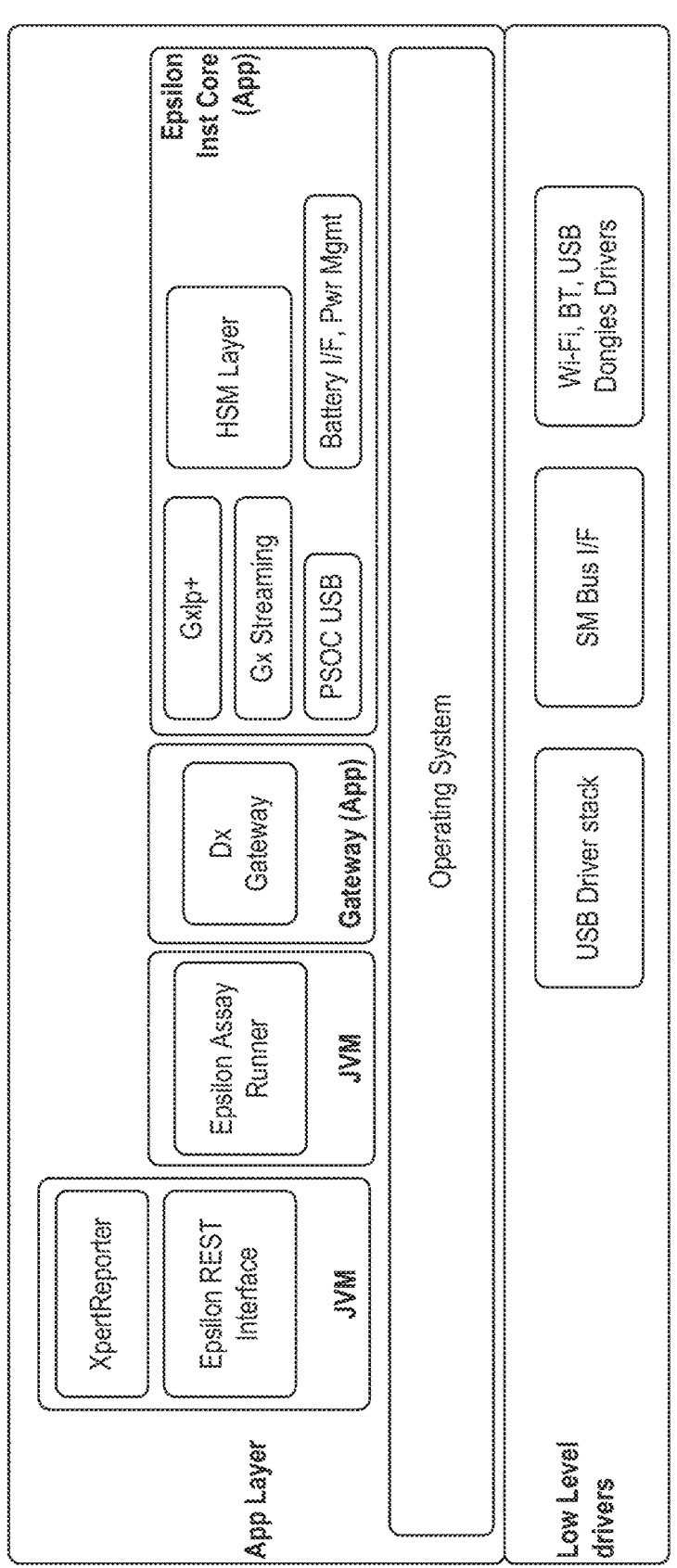
FIGS. 11A-11B are schematics of the system and the optical unit and computer system in accordance with some embodiments of the invention.

FIG. 11A provides a logical view of software executed by the diagnostic device, according to an embodiment. As illustrated, the software can include low level drivers including the universal serial bus (USB) driver stack, SM Bus I/F, and Wi-Fi, Bluetooth, and USB dongle drivers. The application layer includes the operating system, as well as other applications. These applications can include a JVM having XpertReporter and Epsilon Rest Interface components, a JVM having an Epsilon Assay Runner component, a gateway application having a DX Gateway component, and/or an Epsilon Instrument Core application having GxIp+, Gx Streaming, PSoC USB, HSM Layer, and Battery I/F and Power Management components.

Figure 11B:
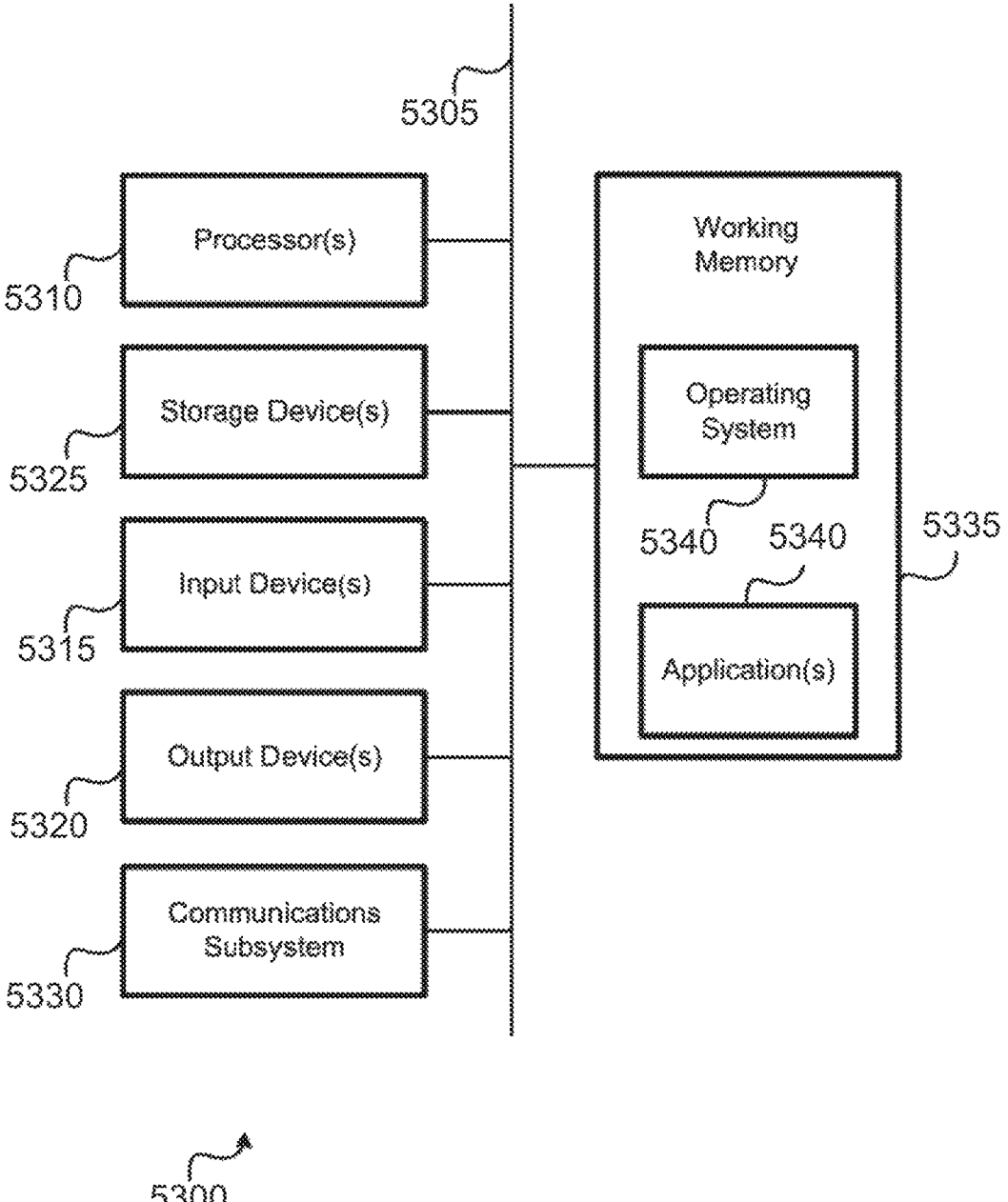

FIG. 11B is an exemplary illustration of a computer system 5300, which can be incorporated, at least in part, into devices and components of a diagnostic assay system described, including but not limited to the Epsilon Instrument, GeneXpert, and GeneXpert Omni. FIG. 11B provides a schematic illustration of a computer system 5300 that can perform the methods provided by various embodiments of the invention. It should be noted that FIG. 11B is meant only to provide a generalized illustration of various components, any or all of which can be utilized as appropriate.

The computer system 5300 is shown comprising hardware elements that can be electrically coupled via a bus 5306 (or may otherwise be in communication, as appropriate). The hardware elements can include a processing unit, such as processor(s) 5310, which can include without limitation one or more general-purpose processors, one or more special-purpose processors (such as digital signal processing chips, graphics acceleration processors, and/or the like), and/or other processing means; one or more input devices 5315, which can include without limitation a mouse, a keyboard, a camera, a microphone, a touchscreen, medical testing hardware and/or diagnostic components, and/or the like; and one or more output devices 5320, which can include without limitation a display device, a printer, and/or the like.

The computer system 5300 can further include (and/or be in communication with) one or more non-transitory storage devices 5325, which can comprise, without limitation, local and/or network accessible storage, and/or can include, without limitation, a disk drive, a drive array, an optical storage device, a solid-state storage device, such as a random access memory ("RAM"), and/or a read-only memory ("ROM"), which can be programmable, flash-updateable, and/or the like. Such storage devices can be configured to implement any appropriate data stores, including without limitation, various file systems, database structures, and/or the like.

In some embodiments, the computer system 5300 can include a communications subsystem 5330, which can include without limitation a modem, a network card (wireless or wired), an infrared communication device, a wireless communication device, and/or a chipset (such as an NFC transceiver, a Bluetooth device, an 802.11 device, a Wi-Fi device, a WiMax device, cellular communication transceiver, etc.), and/or the like. The communications subsystem 5330 can include one or more input and/or output communication interfaces to permit data to be exchanged with a network, other computer systems (e.g., using peer-to-peer communication, as described herein), and/or any other electrical devices described herein. In some embodiments, the computer system 5300 will comprise a working memory 5335, which can include a RAM or ROM device, as described above.

The computer system 5300 can comprise software elements, shown as being currently located within the working memory 5335, including an operating system 5340, device drivers, executable libraries, and/or other code, such as one or more application programs 5345, which can comprise computer programs provided by various embodiments (e.g., the mobile device software, interface software, etc.), and/or can be designed to implement methods and/or software architecture, as described herein. Merely by way of example, methods and/or architecture provided in the other figures appended hereto, might be implemented as code and/or instructions executable by a computer (and/or a processing unit within a computer); in an aspect, then, such code and/or instructions can be used to configure and/or adapt a general purpose computer (or other device) to perform one or more operations in accordance with the described methods.

A set of these instructions and/or code can be stored on a non-transitory computer-readable storage medium, such as the storage device(s) 5325 described above. In some embodiments, the storage medium can be incorporated within a computer system, such as computer system 5300. In some embodiments, the storage medium can be separate from a computer system (e.g., a removable medium, such as an optical disc), and/or provided in an installation package, such that the storage medium can be used to program, configure, and/or adapt a general purpose computer with the instructions/code stored thereon. These instructions can take the form of executable code, which is executable by the computer system 5300 and/or can take the form of source and/or installable code, which, upon compilation and/or installation on the computer system 5300 (e.g., using any of a variety of generally available compilers, installation programs, compression/decompression utilities, etc.), then takes the form of executable code.

Some embodiments can employ a computer system (such as the computer system 5300) to perform methods in accordance with some embodiments of the invention. In some embodiments, some or all of the procedures of such methods are performed by the computer system 5300 in response to processor(s) 5310 executing one or more sequences of one or more instructions (which can be incorporated into the operating system 5340 and/or other code, such as an application program 5345) contained in the working memory 5335. Such instructions can be read into the working memory 5335 from another computer-readable medium, such as one or more of the storage device(s) 5325. Merely by way of example, execution of the sequences of instructions contained in the working memory 5335 can cause the processor(s) 5310 to perform one or more procedures of the methods described herein. Additionally or alternatively, portions of the methods described herein can be executed through specialized hardware.

The terms "machine-readable storage medium" and "computer-readable storage medium," as used herein, refer to any storage medium that participates in providing data that causes a machine to operate in a specific fashion. In some embodiments implemented using the computer system 5300, various computer-readable media can be involved in providing instructions/code to processor(s) 5310 for execution and/or can be used to store and/or carry such instructions/code. In some embodiments, a computer-readable storage medium is a physical and/or tangible storage medium. Such a medium can take the form of a non-volatile media or volatile media. Non-limiting examples of non-volatile media can include, optical and/or magnetic disks, such as the storage device(s) 5325. Non-limiting examples of volatile media can include, without limitation, dynamic memory, such as the working memory 5335.

Non-limiting common forms of physical and/or tangible computer-readable media can include, for example, a floppy disk, a flexible disk, hard disk, magnetic tape, or any other magnetic medium, a CD-ROM, any other optical medium, a RAM, a PROM, EPROM, a FLASH-EPROM, any other memory chip or cartridge, or any other medium from which a computer can read instructions and/or code.

Various forms of computer-readable media can be involved in carrying one or more sequences of one or more instructions to the processor(s) 5310 for execution. Merely by way of example, the instructions may initially be carried on a magnetic disk and/or optical disc of a remote computer. A remote computer can load the instructions into its dynamic memory and send the instructions as signals over a transmission medium to be received and/or executed by the computer system 5300.

The communications subsystem 5330 (and/or components thereof) generally will receive signals, and the bus 5306 then can carry the signals (and/or the data, instructions, etc. carried by the signals) to the working memory 5335, from which the processor(s) 110 retrieves and executes the instructions. The instructions received by the working memory 5335 can optionally be stored on a non-transitory storage device 5325 either before or after execution by the processor(s) 5310.

III. Methodologies and Experimental Results

The following describes various methodologies of implementing the above described aspects into an exemplary diagnostic system, and depict experimental results that demonstrate the advantages of the concepts described herein. It is appreciated that these illustrate specific embodiments, and that various other embodiments can be realized.

Figure 12:
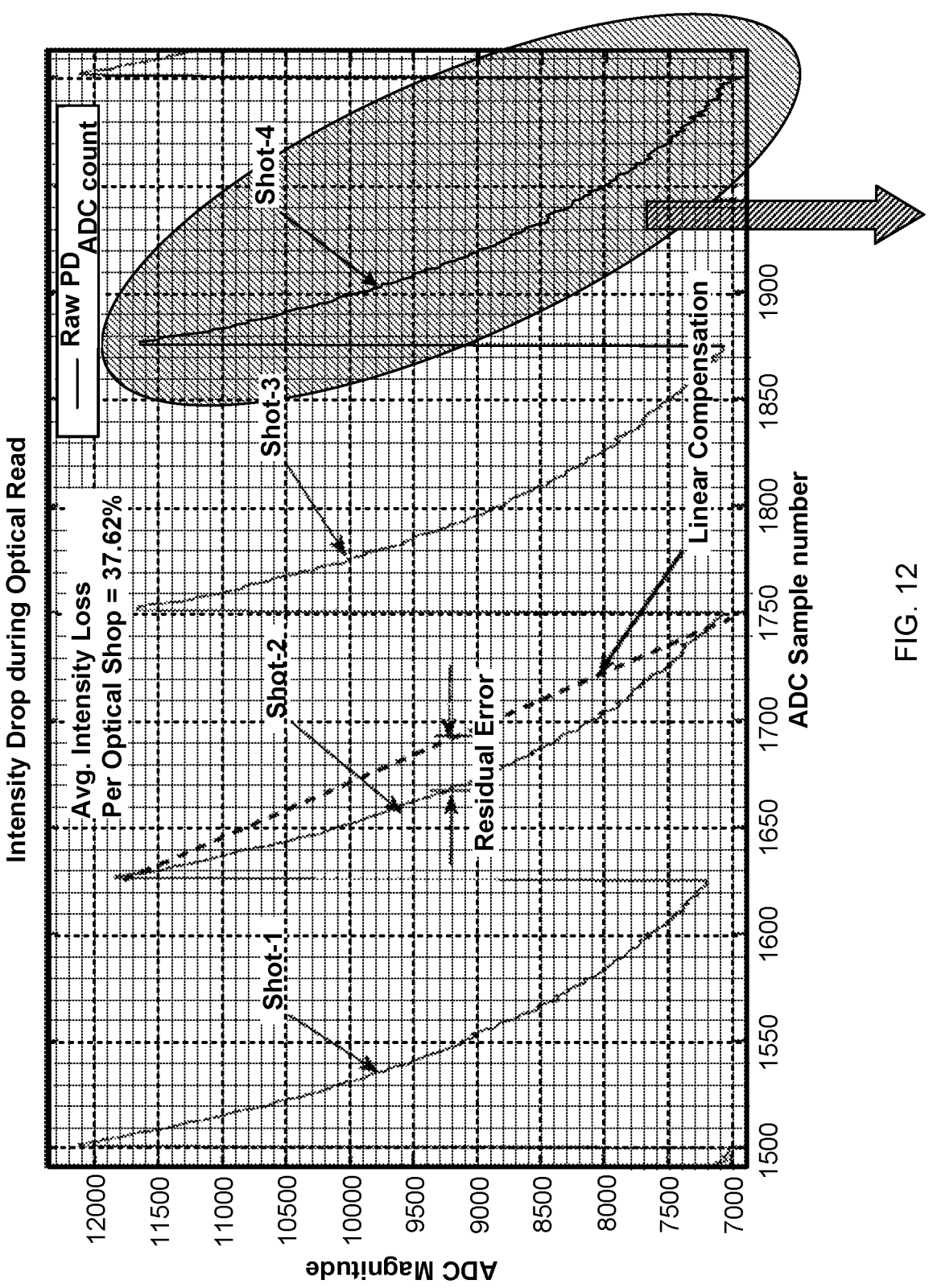
FIG. 12 depicts LED intensity drop during optical read due to temperature variations and associated linear compensation of the signal in accordance with some embodiments.

FIG. 12 shows an example of intrashot compensation of variation in LED output in accordance with some embodiments. As shown, the intra-shot photo-diode response can vary as much as 35% from beginning to end. The LED photon emission decreases as the LED junction temperature heating up during the shot. As shown in the figure, the exponential time-constant with two or more time-constants can correctly compensate this fluorescence (FL) intensity loss. However, the intensity loss is not the same between shot to shot or run to run. Ambient temperature and wavelength also introduce variation in the intensity loss. Thus, it is further advantageous to correctly compensate this intensity loss across the full range of photo diode output signal, intra-shot, inter-shot, over all optical reads and at all permissible ambient temperature.

Figure 13:
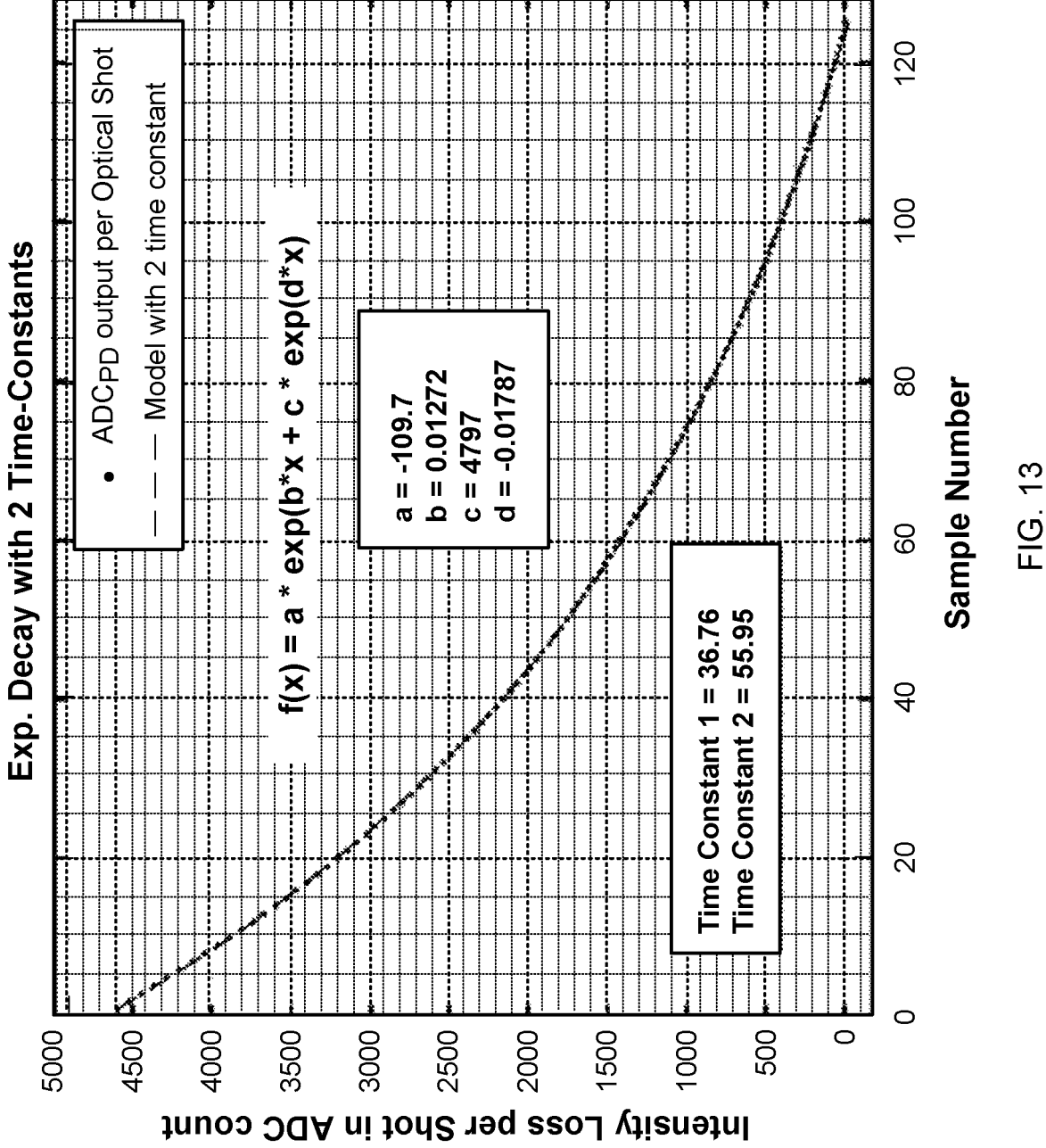
FIG. 13 depicts estimated LED intensity loss per optical output shots in ADC count.

FIG. 13 shows a detail of Shot-4 from FIG. 12. In particular, FIG. 13 shows an exponential function with two time-constants that can compensate the fluorescence (FL) intensity loss correctly. However, the intensity loss is not the same between shot to shot or run to run and hence time-constants derived in one run may not work all the time, and are too complex to derive in real-time.

Figure 14:
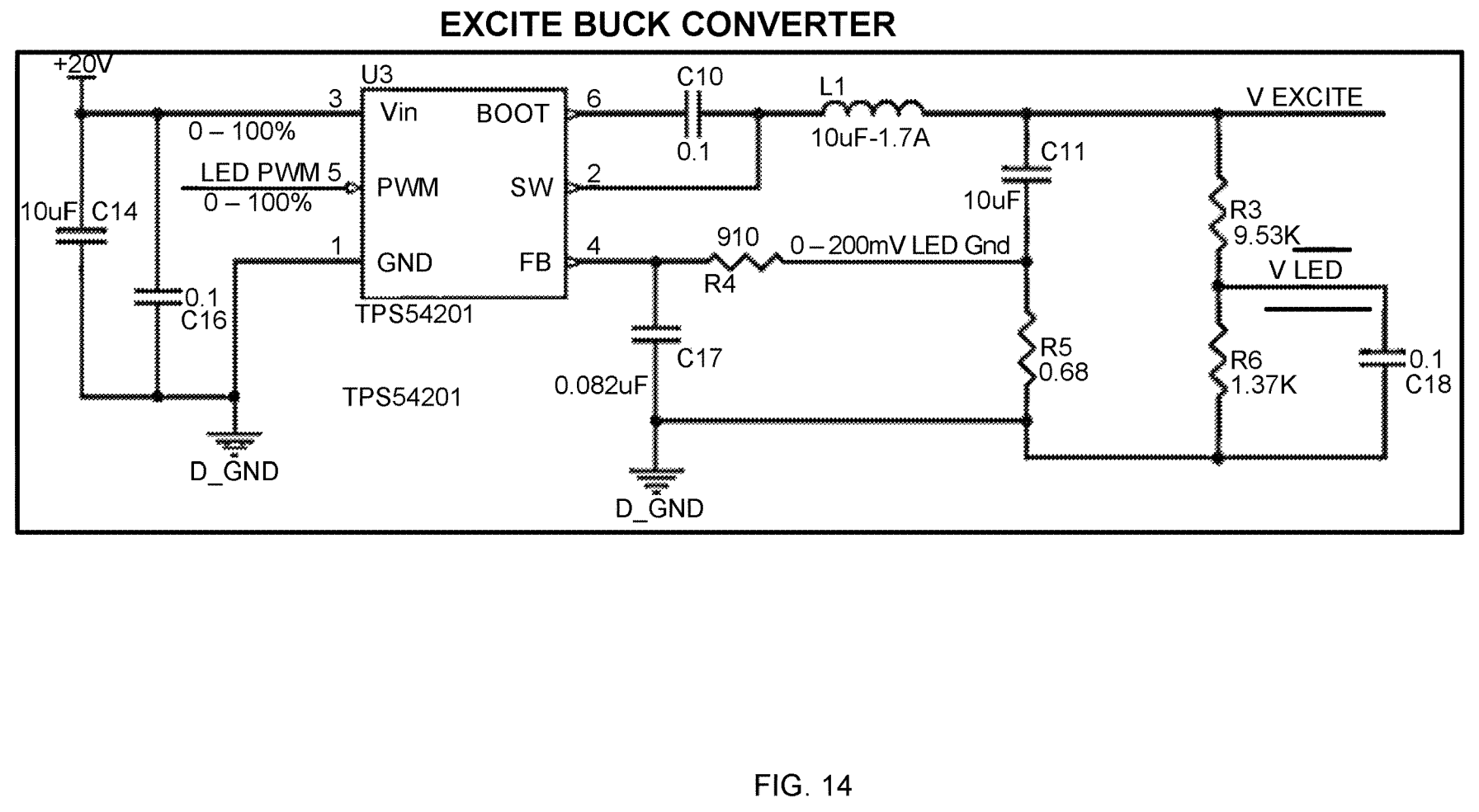
Figure 15:
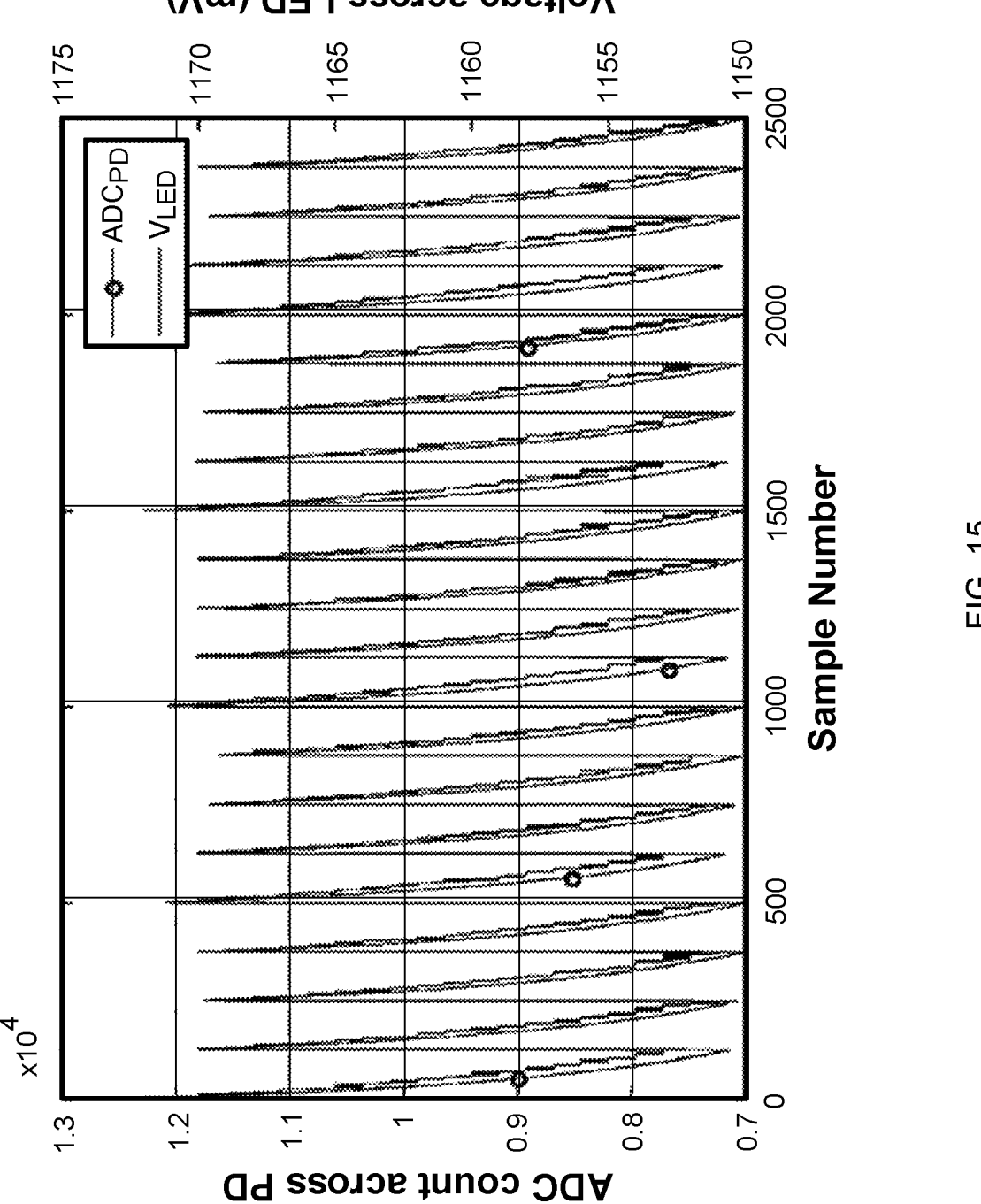
FIG. 15 depicts a time domain plot of voltage across LED and digitized photo diode output (ADCPD) in accordance with some embodiments.
Figure 16:
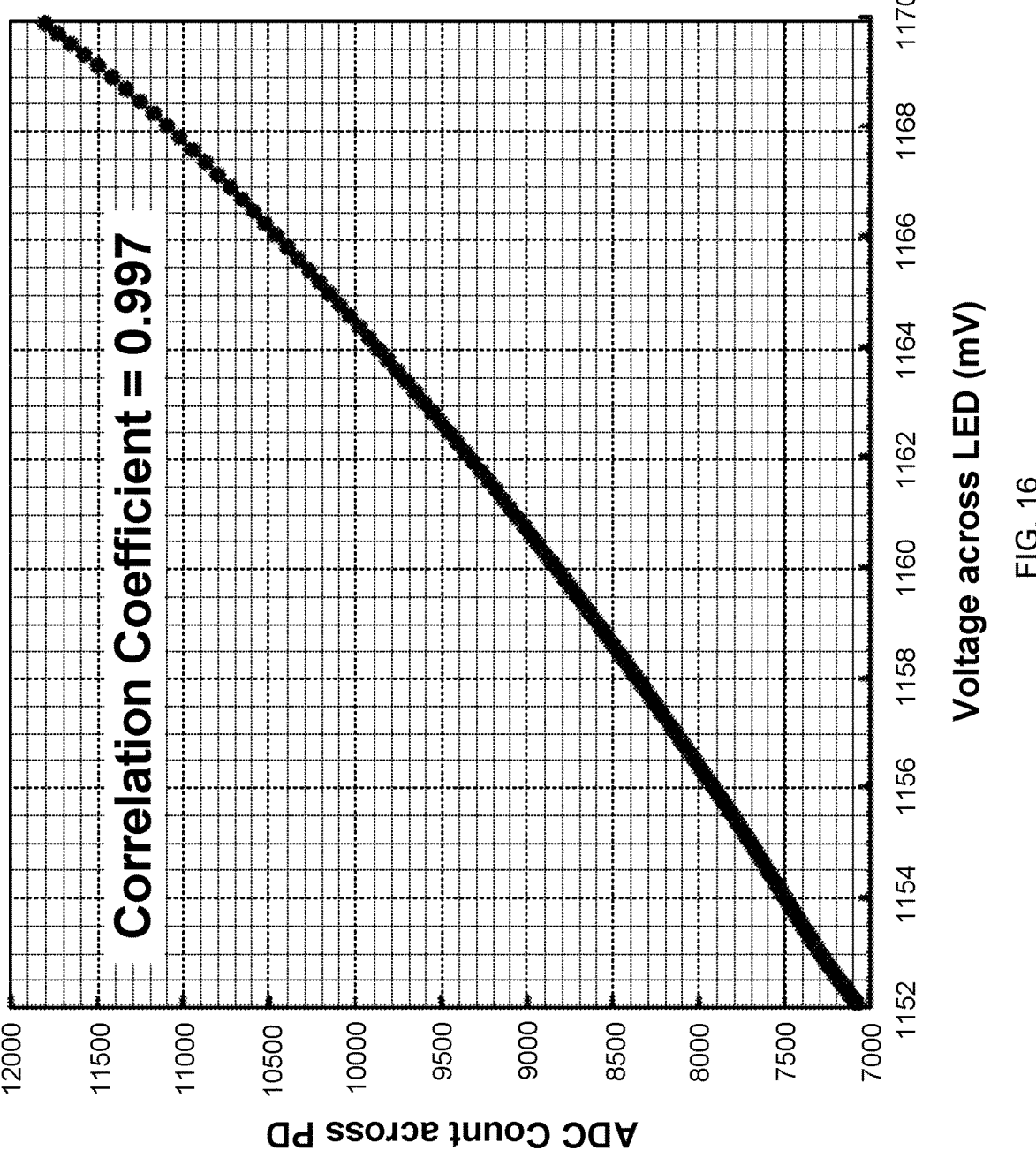
FIG. 16 depicts a correlation between mean voltage across LED during each shot and mean ADCPD at that time-instant in accordance with some embodiments.

In another aspect, an ITM ("Information-theoretic architecture) approach, described further below, can be utilized to solve the thermal effect noted above. In this example, the ITM approach is applied to a semi-conductor physics-based signal model, which informs the system how to achieve intrinsic compensation for the LED thermal effect. FIG. 14 shows an exemplary circuit diagram that can be used with this approach. FIG. 15 demonstrates that coherent sampling of LED voltage at the reference intra-shot current serves as a proxy for the junction temperature rise that causes the change in photon emission amplitude and spectrum. As shown in FIG. 16, there is an excellent correlation between voltage across the LED (VLED) and photo diode output (ADCPD).

In one example, the following algorithms and mathematical steps can be utilized to achieve the LED compensation techniques noted above. In this example, a least-square optimization can be used per the equations below to optimally estimate a slope ($m_j$) and an intercept ($b_j$), such as by the following equations:

$$y_i = [v_j \; 1]\begin{bmatrix} \widehat{m}_i \\ \widehat{b}_i \end{bmatrix}$$

$$y_i = A_j \begin{bmatrix} \widehat{m}_i \\ \widehat{b}_i \end{bmatrix} \text{ where } A_j = [v_j \; 1]$$

$$A_j^T y_j = [A_j^T A_j] \begin{bmatrix} \widehat{m}_j \\ \widehat{b}_i \end{bmatrix}$$

$$\begin{bmatrix} \widehat{m}_i \\ \widehat{b}_i \end{bmatrix} = [A_j^T \; A_j]^{-1} [A_j^T \; y_j]$$

$$\hat{y}_i = M_j \cdot v_{ref} + b_j$$

where pivot point $v_{ref}$ = 90% of all Voltage value where:

$y_{ij}$ = Photo-diode sample $i$ on $j^{th}$ Optical read;

$v_{ij}$ = LED voltage sample $i$ on $j^{th}$ Optical read;

$m_j$ = LED voltage sample $i$ on $j^{th}$ Optical read;

$b_j$ = an intercept for $j^{th}$ Optical read.

$\hat{y}$ = Optimal Estimate of the photo-diode output on the $j^{th}$ optical read.

Then signal model of the form can be obtained by:

$$y_{ij} = M_j v_{ij} + b_j$$

$$y_i = \begin{bmatrix} y_{0,j} \\ y_{1,j} \\ \vdots \\ y_{n-1,j} \end{bmatrix} \quad v_j = \begin{bmatrix} v_{0,j} \\ v_{1,j} \\ \vdots \\ v_{n-1,j} \end{bmatrix} \quad 1 = \begin{bmatrix} 1 \\ 1 \\ \vdots \\ 1 \end{bmatrix}$$

In one conventional approach for operating an LED output that includes a series of shot, referred to herein as JOP ("jump-off-point"), the instrument control unit has a coarse-grain optical read architecture, for example, four shots/dye reporter/optical read applies 20 msec per LED shot (i.e., exposure). In one implementation, 125 photo-diode voltage samples are recorded per shot—or 500 per optical read. A thermistor near the LED (disposed on the LED excite block) is used to increase the signal/noise ratio for LED control.

In a novel approach for operating this LED output, referred to herein as ITM ("Information-theoretic architecture"), the control unit utilizes a fine-grain optical read architecture, for example, 20 shots/dye reporter/optical read applies 2.9 msec per LED shot/exposure. In an exemplary implementation, 80 photo-diode voltage samples are recorded per shot—or 1600 per optical read. Certain distinctions between this novel approach and the conventional approach can be further understood by referring to the following comparison table:

TABLE 1

| Comparison of LED control approaches | |
|---|---|
| JOP | ITM |
| Fs (sample frequency) = 6.3 kHz | Fs = 27.3 kHz |
| 17-bit/sample | 15-bit/sample |
| # Shots/Optical Read = 4 | # Shots/Optical Read = 20 |
| # Samples/shot = 125 | # Samples/shot = 80 |
| # Samples/Optical read = 500 | # Samples/Optical read = 1600 |
| # Warm-up time = 2 ms | Warm-up time = 600 us |
| Optical read time = 1.6 s | Optical read time = 26 m |

Accordingly, the LED output can be controlled by various algorithms utilizing the ITM approach described above, including any of the following:

Algorithm 0: Output of the optical read is mean of all samples acquired from all shots;

Algorithm 1: Output of the optical read is the mean of all the samples acquired from all shots; after the intra-shot photo-diode variation is removed via regression; and Algorithm 2: Output of the optical read is the mean of all samples acquired from all shots after intrinsic LED compensation is applied.

Figure 17:
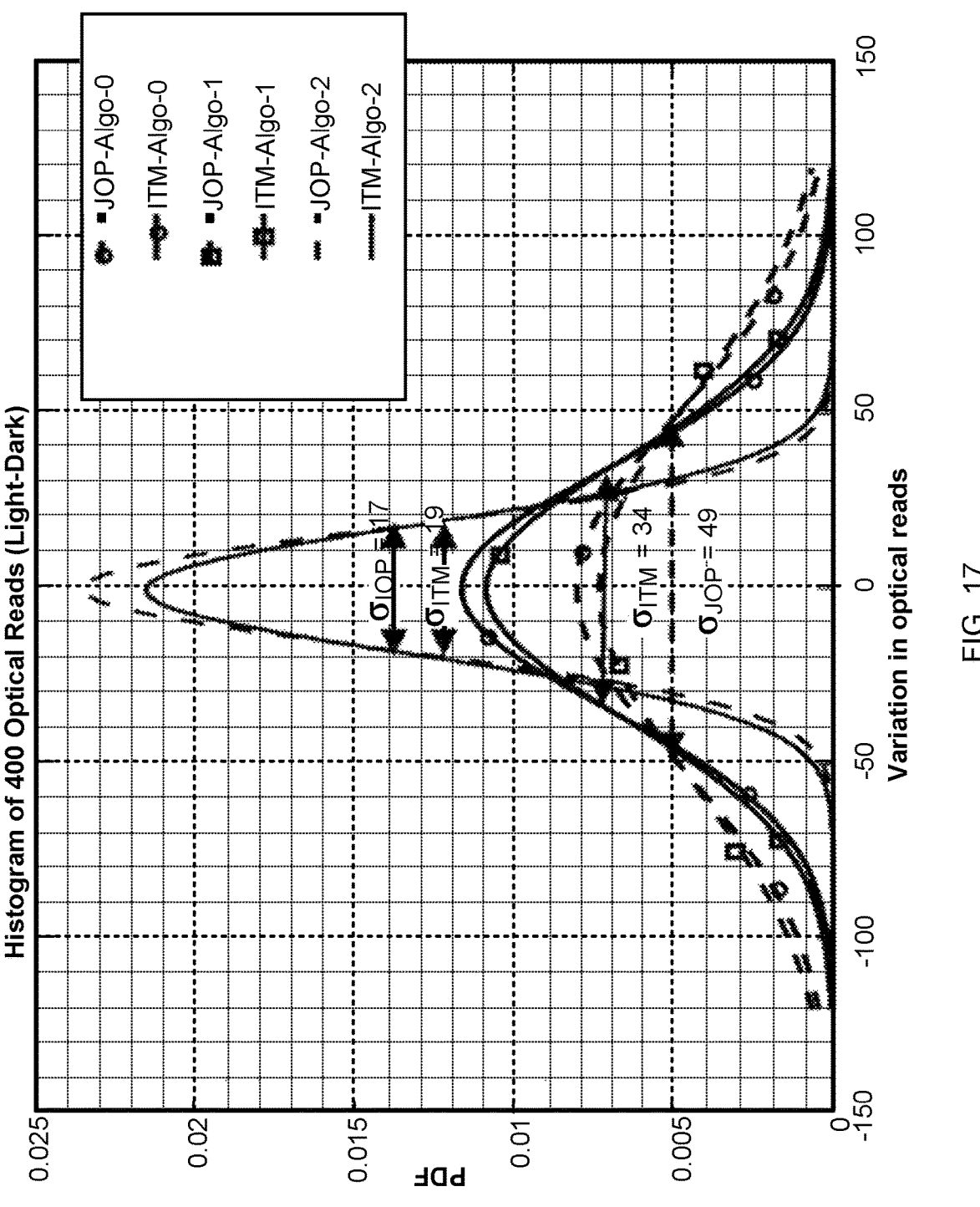
FIG. 17 depicts a histogram of optical read, in accordance with some embodiments.

FIG. 17 demonstrates the improvement of the ITM based approach algorithms as compared to the JOP approach algorithms. By utilizing the ITM approach, an improvement of more than 50% in SD (standard deviation) with the intrinsic LED compensation can be achieved. As shown, the signal variance for the ITM is negligibly different from the JOP algorithm, however, this approach allows seven times less shot-time and extended design life without significant noise variance impact.

Figure 18:
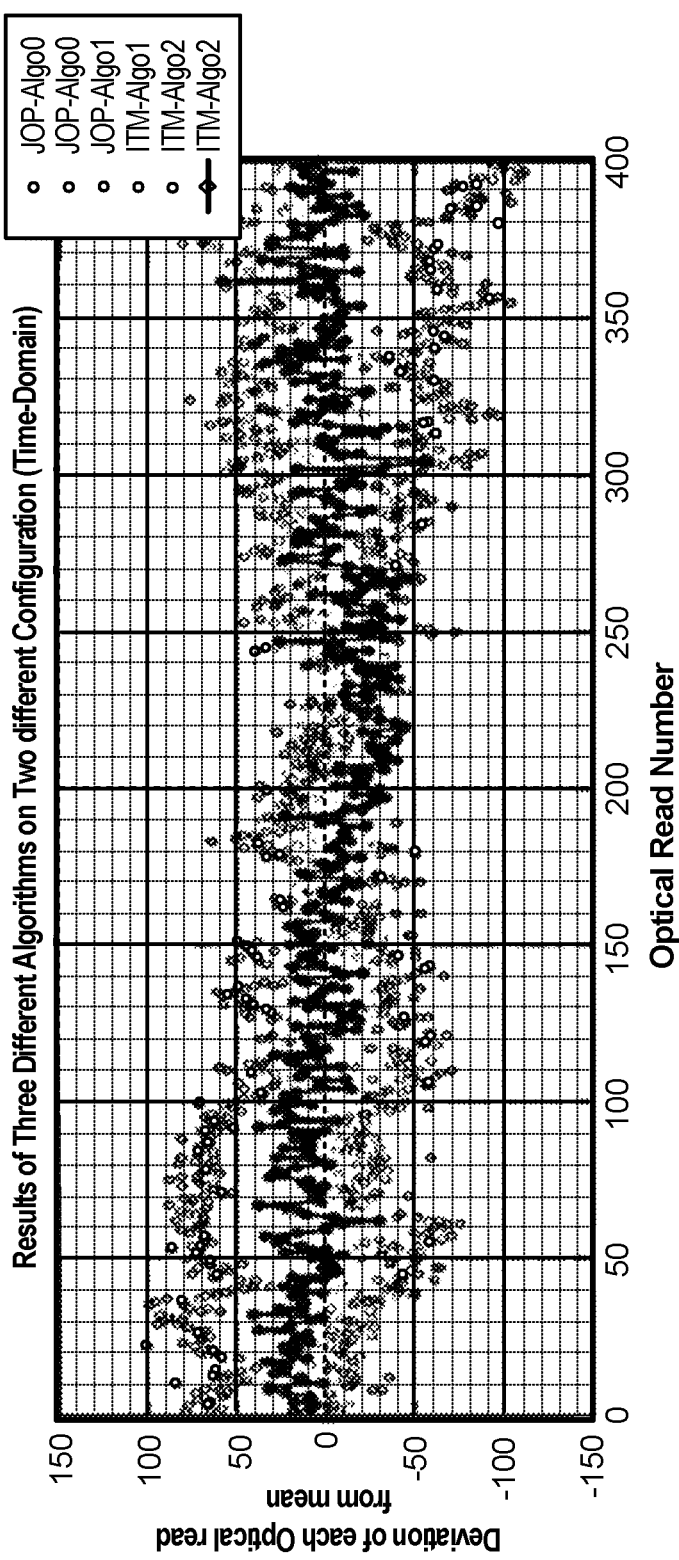
FIG. 18 depicts the time domain plot of FIG. 17, which shows the results of three different algorithms of two different approaches of performing optical read in an optical component, in accordance with some embodiments.

FIG. 18 shows another comparison of the ITM and JOP approaches, depicting the results of three different algorithms for each approach. In this example, there were 400 optical reads over a 3 hour period-20 seconds between reads. The intrinsic LED compensation in ITM-Algorithm 2 removes the short-term and long-term drift in the optical signal as compared to the JOP-reducing the standard deviation by over a factor of 2.

In summary, the ITM approach provides marked improvements over the conventional JOP approaches. When considering the metric of dye reporters, the fine-grain architecture embodied within ITM makes it possible to allocate more time to "noisy", optical channels to equalize the variance across five out of ten dye reporters. One key advantage is the reduction of LED "on time" (i.e. shot). This approach reduces the LED junction temperature rise that impacts the photon emission rate and spectrum, and lowers operating temperature, which increases the design life of the LED. These improvements can be further understood by referring to the following table.

TABLE 2

| | | | | | | | | | X times improvement in SD (From Algo-1 JOP |
| | Intensity Loss per | Intensity Loss per | Algo-0 | | Algo-1 | | Algo-2 | | |
| Channel Number | shot (JDP) | shot (ITM) | σ at JOP | σ at ITM | σ at JOP | σ at ITM | σ at JOP | σ at ITM | to Algo-2 ITM) |
|---|---|---|---|---|---|---|---|---|---|
| Ch14 | 1.06% | 0.46% | 21.91 | 4.98 | 21.75 | 6.05 | 20.56 | 5.37 | 4.1 ✓✓✓ |
| Xh21 | 10.63% | 6.35% | 15.43 | 21.93 | 19.62 | 26.24 | 16.03 | 13.29 | 1.5 ✓✓ |
| Ch29 | 0.75% | 0.13% | 7.49 | 5.16 | 7.8 | 6.5 | 10.59 | 5.3 | 1.5 ✓✓ |
| Ch15 | 1.07% | 0.45% | 16.82 | 12.02 | 17.79 | 12.95 | 16.52 | 11.84 | 1.5 ✓✓ |
| Ch9 | 0.14% | −0.09% | 8.87 | 2.82 | 9.51 | 4.38 | 8.89 | 3.2 | 3.0 ✓✓✓ |

In another aspect, the LED voltage based thermal compensation can be applied to the entire operating temperature range of the LED within the instrument. In one implementation, the operating temperature range of the instrument is within 10° C. to 45° C. In conventional devices, thermal compensation is based on a temperature sensor reading disposed on the excite block (EB) and is applied over the operating range of the instrument. The EB sensor is a thermistor (i.e., porch thermistor), which is disposed on the other side of a thermal-electro cooler of the thermal-cycling unit. Thus, both the EB sensor temperature reading and compensation is indirect. By utilizing the voltage across LED signal, the temperature at the junction of the LED can be more accurately determined and thermal compensation can be improved significantly. In one implementation, this approach utilized the following equation:

$$\hat{y}_j = M_j \cdot v_{ref} + b_j$$

where pivot point $vref$ = 90% of $allVoltagevalue$.

Compensating for slope and intercept for the thermal compensation can be achieved by:

$$\hat{y}_J = a(T_0, TEB) \cdot M_j * v_{ref} + \gamma(\alpha(To, T_{EB}), M_j)$$

where $T0$ = Slope at $Ref. Temp$;

$T_{EB}$ = Excite block temperature;

$M_j$ = slope for the $jth$ shot; and $\alpha \& \Upsilon$ are functions.

Figure 19:
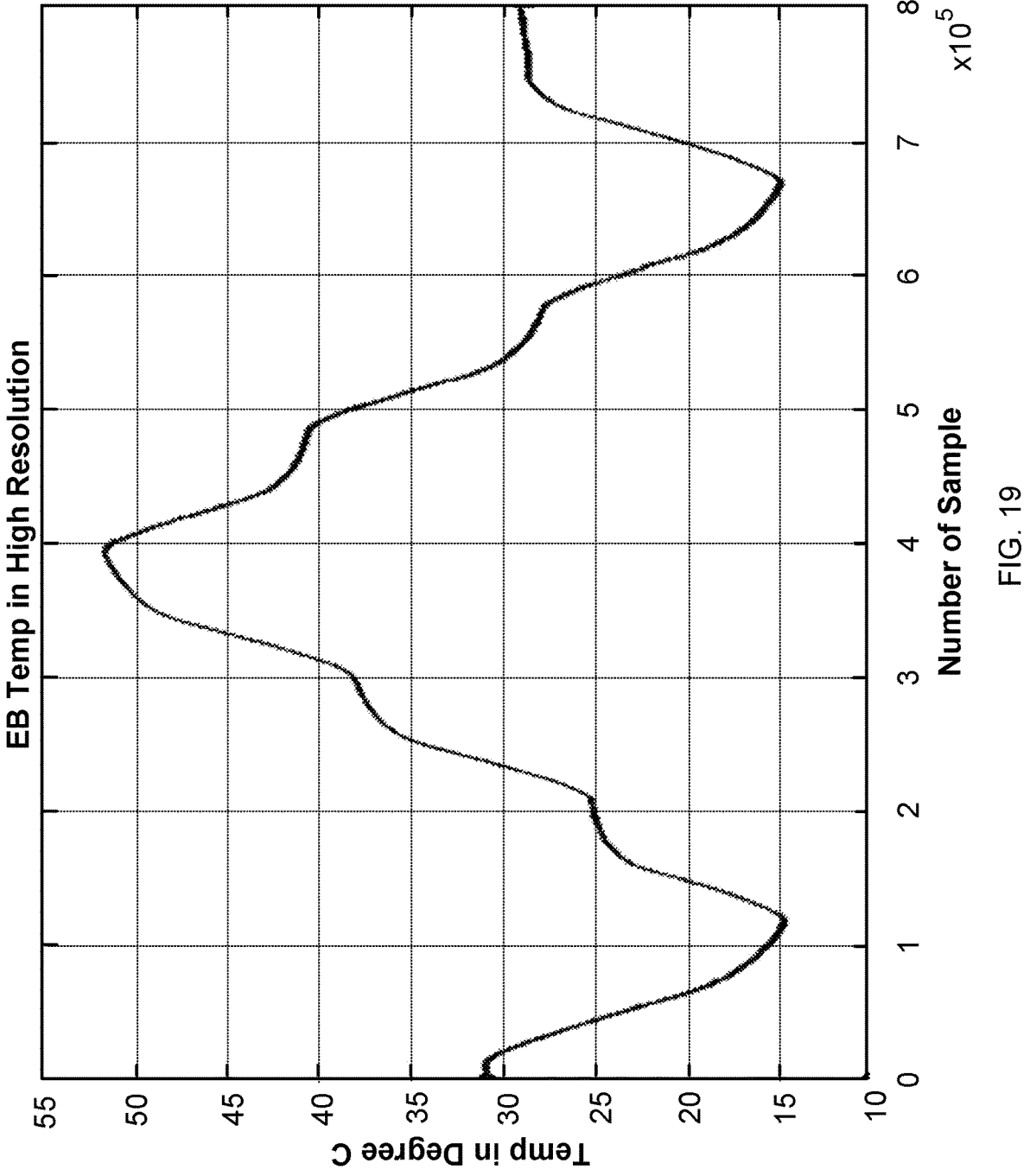
FIG. 19 depicts a conventional control approach utilizing the excite block temperature.
Figure 20:
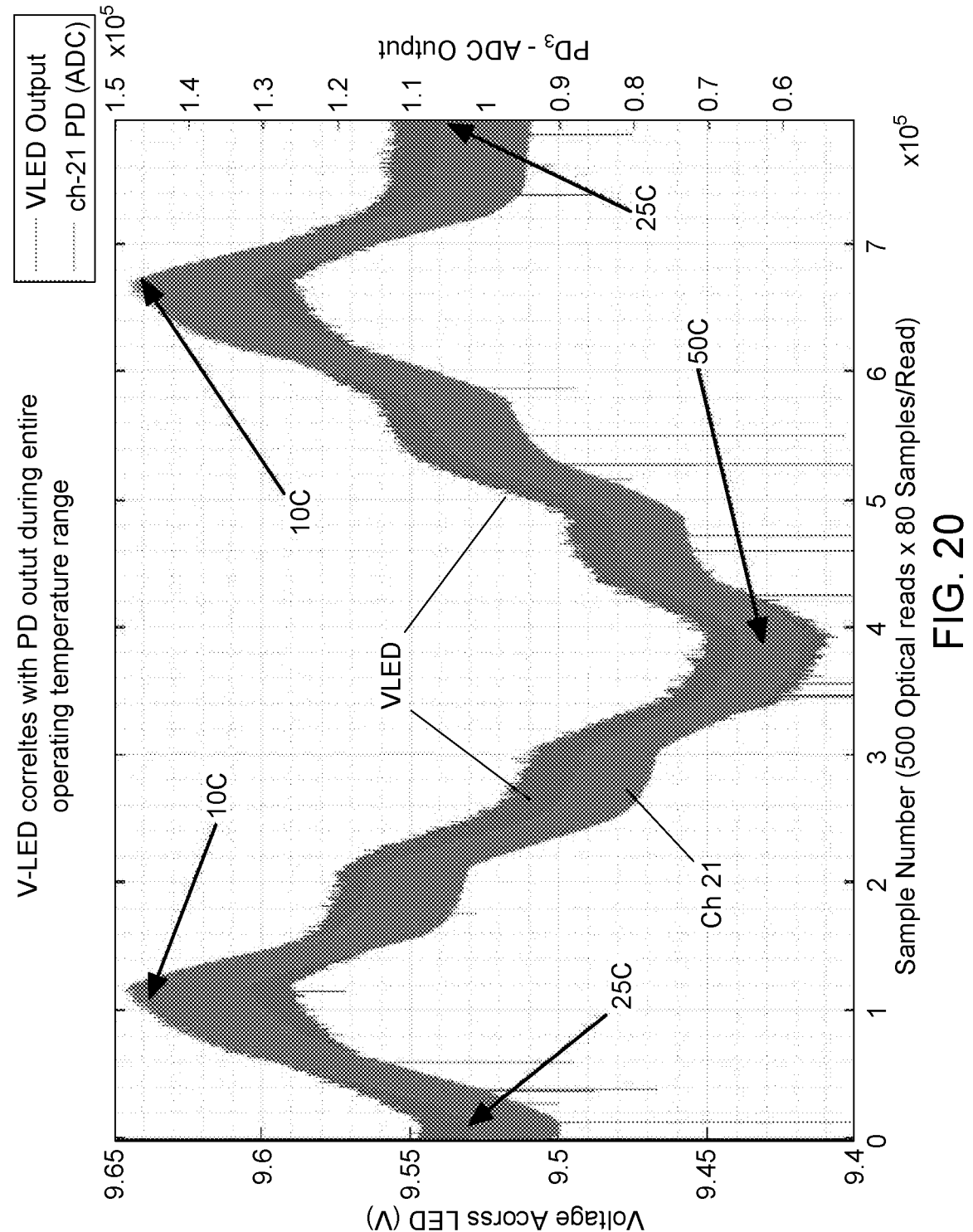
FIG. 20 depicts a control approach utilizing the LED voltage, in accordance with some embodiments.

FIG. 19 shows a test environmental condition and FIG. 20 shows a close correlation of voltage across the LED with the photo diode output during the entire range of the test condition. FIG. 19 shows the excite block (EB) temperature in high resolution, which provides only indirect temperature of the LED that doesn't always match the junction temperature at the LED over the entire operating range. In contrast, FIG. 20 shows that the LED voltage (V-LED) correlates with the photonic output over the entire operating temperature range. As can be seen, the photon output fluctuates based on the temperature such that the higher the temperature, the lower the photonic emission and vice versa. This correlation makes it possible to correctly compensate junction temperature impact over the entire operating range.

Figure 21:
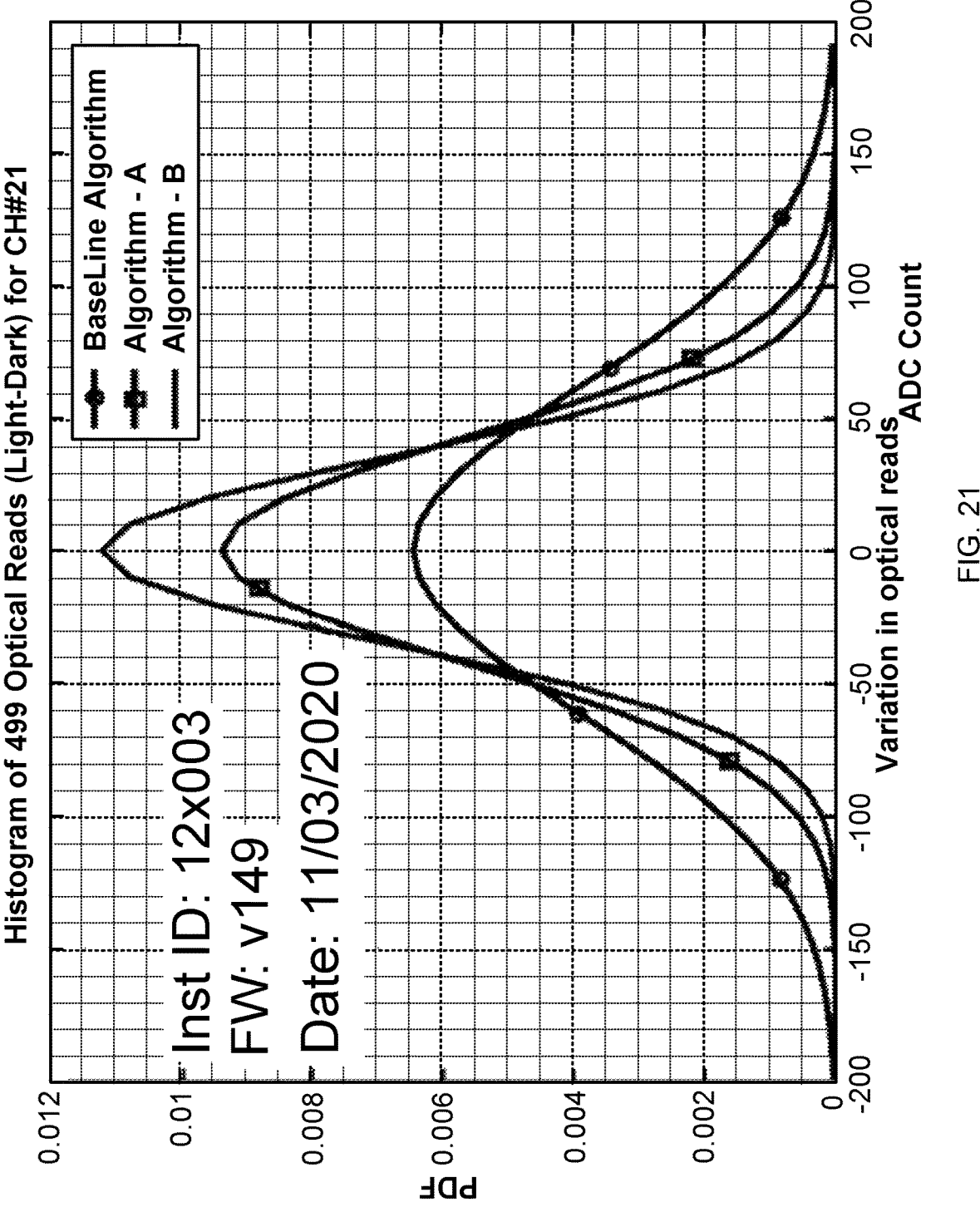
FIG. 21 depicts a histogram of optical reads with compensation based on JOP approach.
Figure 22:
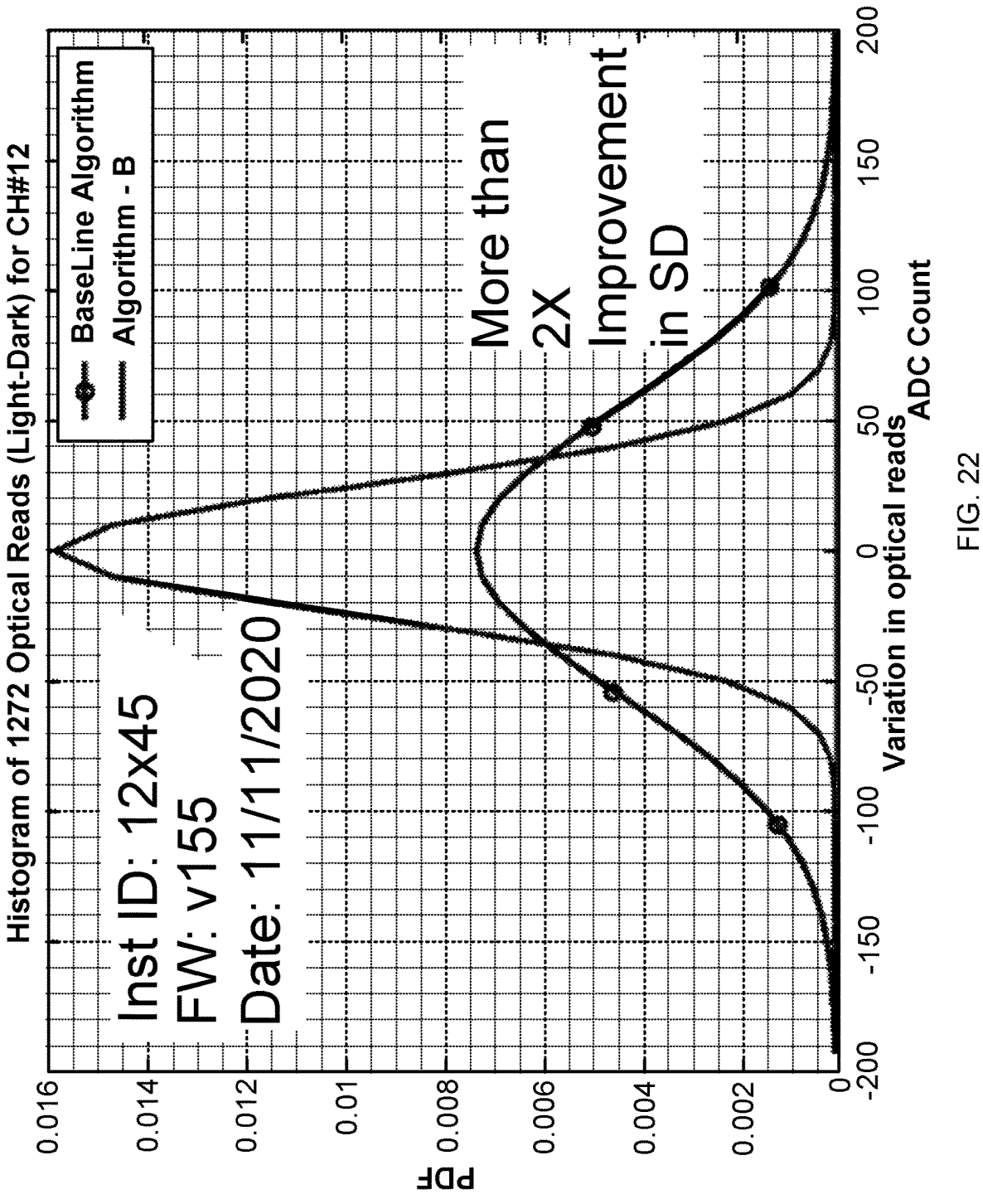
FIG. 22 depicts a histogram of optical reads with thermal compensation based on ITM approach, in accordance with some embodiments.

FIGS. 21 and 22 show the marked improvements in thermal compensation provided by the ITM algorithm over the entire operating range of the LED. There is a significant improvement over the entire operating range with Algorithm-B (ITM Algorithm 2). The ambient temperature was varied from 11° C.-53° C. and approximately 500 LED shot reads were measured. As discussed previously, the baseline algorithm works on the EB temperature sensor which is indirect compensation. The LED voltage based compensation is direct and intrinsic to LED junction temperature change, since the LED voltage is a proxy of the junction temperature. Accordingly, the RFU variation for Ch-21, one of the worst performing channels, has been reduced from ±15 RFU to ±5.7 RFU. In this example, the target goal is under ±6 RFU.

In another aspect, experimental studies have found and established that crosstalk issues from one dye reporter to another dye reporter largely depends on imbalance of the optical calibration matrix that is used to calibration the optical component (i.e., LEDs), particularly after manufacture and/or service. The root cause of imbalance of the optical calibration matrix is LED degradation of one or more of the LEDs. For example, LED degradation of one of five LEDs can cause imbalance, thereby causing crosstalk. This crosstalk issue can be addressed as the I-V curve characteristics at the time of manufacturing is saved (e.g. saved in EEPROM) and the current can be adjusted to provide the same LED intensity even after the LED degradation in order to remove any crosstalk issue that develops due LED degradation.

Figure 23:
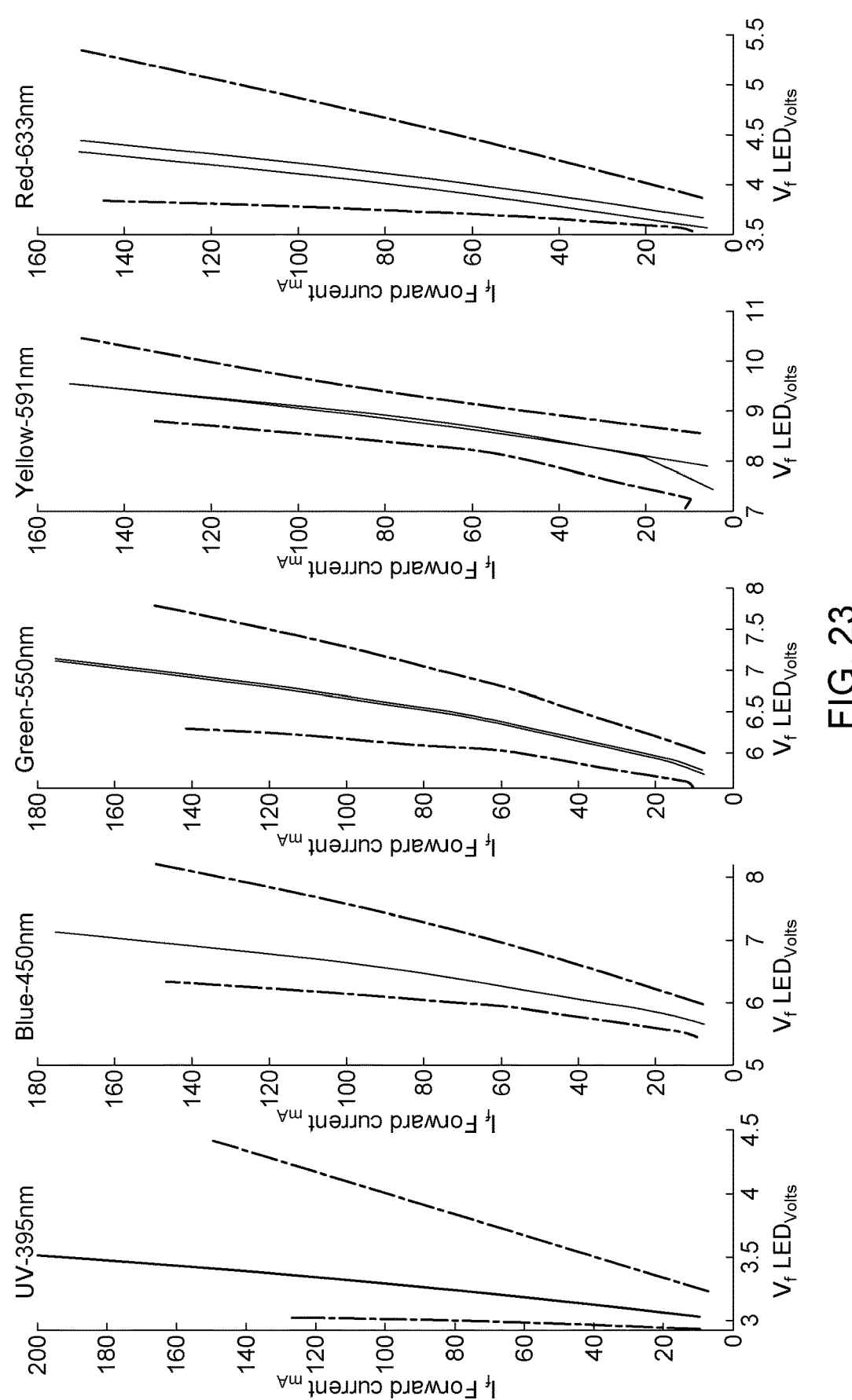
FIG. 23 depicts shows I-V curves of LED output demonstrating crosstalk associated with LED degradation of a red LED in an optical calibration matrix.

FIG. 23 depicts an I-V curve for each LED color at the time of manufacture and at the time of significant crosstalk. The optical calibration matrix is out of calibration when one of the five LEDs degrades. In the example below, the red LED degrades and causes crosstalk (see arrow) (e.g. from CF6à CF4). FIG. 23 (I-V data) shows that LED (red in this example) degrades over the time and loses the intensity. An adjustment in LED current can counter the LED intensity loss on optical reads. The instrument collects the I-V data at every instrument boot/power up. An automatic LED calibration algorithm can adjust the LED drive current to keep the LED intensity same as the intensity set at time of the last optical calibration. It is appreciated this could be applied to any of the LED colors and/or various other arrangements.

It will be apparent to those skilled in the art that substantial variations can be made in accordance with specific requirements. For example, customized hardware can be used, and/or particular elements can be implemented in hardware, software (including portable software, such as applets, etc.), or both. Connection to other computing devices such as network input/output devices can be employed.

The methods, systems, and devices discussed above are examples. Various configurations can omit, substitute, or add various procedures or components as appropriate. For instance, in alternative configurations, the methods can be performed in an order different from that described, and/or various stages can be added, omitted, and/or combined. Also, features described with respect to certain configurations can be combined in various other configurations. Different aspects and elements of the configurations can be combined in a similar manner. Also, technology evolves and some of the elements as described are provided as non-limiting examples and thus do not limit the scope of the disclosure or claims.

Specific details are given in the description to provide a thorough understanding of exemplary configurations (including implementations). However, configurations can be practiced without these specific details. For example, well-known circuits, processes, algorithms, structures, and techniques have been shown without unnecessary detail in order to avoid obscuring the configurations. This description provides exemplary configurations that do not limit the scope, applicability, or configurations of the claims. Rather, the preceding description of the configurations will provide those skilled in the art with an enabling description for implementing described techniques.

Also, configurations can be described as a process which is depicted as a flow diagram or block diagram. Although each can describe the operations as a sequential process, some of the operations can be performed in parallel or concurrently. Furthermore, examples of the methods can be implemented by hardware, software, firmware, middleware, microcode, hardware description languages, or any combination thereof. When implemented in software, firmware, middleware, or microcode, the program code or code segments to perform the necessary tasks can be stored in a non-transitory computer-readable medium such as a storage medium. Processors can perform the described tasks.

Having described several exemplary configurations, various modifications, alternative constructions, and equivalents can be used without departing from the spirit of the disclosure. The above elements can be components of a larger system, wherein other rules can take precedence over or modify the application of the invention. Accordingly, the above description does not bound the scope of the claims. All patents, patent applications, and other publications cited in this application are incorporated by reference in their entirety for all purposes.

What is claimed is:

1. A diagnostic assay instrument comprising:
a light-emitting diode (LED) configured to provide an optical output for excitation of a biological sample received within the instrument to monitor performance of an assay;
an optical detector configured to detect reactions in the sample in response to optical excitation within the assay; and
a control unit having a processor and a voltage sensor, the control unit configured to operate the LED to monitor performance of the assay, wherein the processor includes instructions recorded thereon configured for:
measuring a voltage across the LED to operate at a given current; and
correlating the voltage to a junction temperature of the LED such that the voltage is a proxy of the junction temperature;

wherein the control unit is configured such that the voltage across the LED is within a voltage range, wherein the control unit is further configured to:
monitor the entire voltage range at a first resolution, and
monitor a sub-range at a second resolution higher than the first resolution.

2. The instrument of claim 1 wherein the control unit is further configured to:
determine a characteristic of the LED, control the LED based on the measured voltage, or a combination thereof.

3. The instrument of claim 2 wherein the correlation is determined without any temperature sensor input.

4. The instrument of claim 2 wherein the characteristic of the LED is determined by obtaining an I-V curve during an output pulse of the LED and comparing to a reference I-V curve.

5. The instrument of claim 2 wherein the control unit is configured to determine the characteristic upon each start-up of the LED.

6. The instrument of claim 2 wherein the control unit is configured to determine the characteristic during operation of the LED.

7. The instrument of claim 1 wherein the control unit is configured to use the measured voltage to reduce a noise-to-signal ratio of the LED signal.

8. The instrument of claim 1, wherein the second resolution is at least an order of magnitude higher than the first resolution.

9. The instrument of claim 1, wherein the control unit is configured to increase resolution of the sub-range by amplifying the voltage signal within the sub-range.

10. The instrument of claim 1, wherein the control unit is configured to increase resolution of the sub-range by:
outputting a reference voltage in the sub-range and
comparing the reference voltage to the LED signal within the sub-range.

11. The instrument of claim 10, wherein the control unit is further configured to multiply a difference between the reference voltage and the voltage signal by an amplification gain, thereby increasing the resolution of the voltage measurement in the sub-range.

12. A method of monitoring an optical component of a diagnostic instrument, the method comprising:
starting-up, operating, or starting-up and operating an LED to provide a photonic output;
measuring, with a control unit operably coupled to the LED, a voltage across the LED operating at a given current, wherein the voltage across the LED is within a voltage range, and wherein measuring the voltage across the LED comprises:
monitoring the entire voltage range at a first resolution, and
monitoring a sub-range at a second resolution higher than the first resolution; and
correlating the voltage to a junction temperature of the LED such that the voltage is a proxy of the junction temperature.

13. A diagnostic instrument comprising:
an LED configured to provide an optical output for excitation of a biological sample received within the instrument for an assay to detect a target analyte;
an optical detector configured to detect reactions in the sample in response to optical excitation to detect the target analyte; and a control unit having a processor and a voltage sensor, the control unit configured to operate the LED to monitor performance of the assay, wherein the processor includes instructions recorded thereon configured for:

measuring a voltage across the LED during operation at a given current;

correlating the voltage to a junction temperature of the LED such that the voltage is a proxy of the junction temperature;

determining fluctuations in the junction temperature of the LED in real-time; and controlling operation of the LED based on the real-time determinations to compensate for fluctuations in photonic output of the LED due to changes in the junction temperature;

wherein the control unit is configured such that the voltage across the LED is within a voltage range, wherein the control unit is further configured to:

monitor the entire voltage range at a first resolution, and monitor a sub-range at a second resolution higher than the first resolution.

14. A method of operating an LED in a diagnostic instrument, the method comprising:

operating, with a control unit, the LED of the diagnostic instrument, to provide an optical output for excitation of a biological sample received within the instrument for an assay to detect a target analyte;

operating, with the control unit, an optical detector to detect reactions in the sample in response to optical excitation to detect the target analyte;

measuring, with the control unit, a voltage across the LED during operation when operating at a given current, wherein the voltage across the LED is within a voltage range, and wherein measuring the voltage across the LED comprises:

monitoring the entire voltage range at a first resolution, and monitoring a sub-range at a second resolution higher than the first resolution;

correlating, with the control unit, the LED voltage to a junction temperature of the LED such that the voltage is a proxy of the junction temperature;

determining, with the control unit, fluctuations in the junction temperature of the LED in real-time based on the correlation; and controlling, with the control unit, operation of the LED based on the real-time determinations to compensate for fluctuations in photonic output of the LED due to changes in the junction temperature of the LED.

15. A diagnostic instrument comprising:

a reaction vessel holding a fluid sample to be analyzed by an assay;

a housing configured to receive the reaction vessel;

an optical unit disposed at least partly within the housing, the optical unit comprising:

an LED configured to provide an optical output for excitation of a prepared fluid sample within the reaction vessel;

an optical detector configured to detect reactions in the prepared sample in response to optical excitation within an assay; and a control unit having a processor and a voltage sensor, the control unit configured to operate the LED to monitor performance of the assay, wherein the processor includes instructions recorded thereon configured for:

monitoring a voltage across the LED during operation at a given current, wherein the voltage across the LED is within a voltage range, and wherein monitoring the voltage across the LED comprises:

monitoring the entire voltage range at a first resolution, and monitoring a sub-range at a second resolution higher than the first resolution;

correlating the voltage to a junction temperature of the LED such that the voltage is a proxy of the junction temperature; and determine a characteristic of the LED and/or photonic output based on the correlation.

* * * * *